(12) United States Patent
Wachi et al.

(10) Patent No.: US 12,323,274 B2
(45) Date of Patent: Jun. 3, 2025

(54) DIFFERENTIAL TRANSMISSION SUBSTRATE AND POWER-OVER-DIFFERENTIAL DATA COMMUNICATION DEVICE

(71) Applicant: Hitachi Astemo, Ltd., Hitachinaka (JP)

(72) Inventors: Yusuke Wachi, Tokyo (JP); Takayasu Norimatsu, Tokyo (JP)

(73) Assignee: Hitachi Astemo, Ltd., Hitachinaka (JP)

( * ) Notice: Subject to any disclaimer, the term of this patent is extended or adjusted under 35 U.S.C. 154(b) by 15 days.

(21) Appl. No.: 18/561,655

(22) PCT Filed: Feb. 2, 2022

(86) PCT No.: PCT/JP2022/004125
§ 371 (c)(1),
(2) Date: Nov. 16, 2023

(87) PCT Pub. No.: WO2022/244324
PCT Pub. Date: Nov. 24, 2022

(65) Prior Publication Data
US 2024/0235900 A1 Jul. 11, 2024

(30) Foreign Application Priority Data
May 21, 2021 (JP) ................ 2021-086247

(51) Int. Cl.
*H04L 25/02* (2006.01)
*H04B 3/14* (2006.01)

(52) U.S. Cl.
CPC ......... *H04L 25/0272* (2013.01); *H04B 3/146* (2013.01)

(58) Field of Classification Search
CPC ............... H04B 25/02; H04B 25/0264; H04B 25/0272; H04B 25/0276; H04B 3/02;
(Continued)

(56) References Cited

U.S. PATENT DOCUMENTS 8,508,311 B2 * 8/2013 Wu .................. H04B 3/28
333/33
9,973,940 B1 * 5/2018 Rappaport ........... H04B 3/46
(Continued)

FOREIGN PATENT DOCUMENTS

| JP | 2018-019398 A | 2/2018 |
| JP | 2019-047165 A | 3/2019 |

OTHER PUBLICATIONS

International Search Report with English Translation of International Patent Application No. PCT/JP2022/004125 dated Apr. 19, 2022 (5 pages).

*Primary Examiner* — James M Perez
(74) *Attorney, Agent, or Firm* — Foley & Lardner LLP

(57) ABSTRACT

Provided is a technique of power superposition differential data transmission with low radiation noise at low cost and capable of operating at a radio frequency. A differential transmission board superimposes DC power on a differential data signal from a transmission/reception IC and then transmits the signal to a cable, and includes: a first differential transmission line including two wiring patterns; a second differential transmission line including two wiring patterns; two DC transmission lines that transmit the DC power; two capacitor elements that cut off the DC power and pass only the differential data signal; and two inductor elements that cut off a radio-frequency component that is the differential data signal and pass only a DC component, in which the first differential transmission line and the second differential transmission line are connected in series, in which the two capacitor elements are connected in series to the second differential transmission line, in which the second differential transmission line and the DC transmission line are connected via the two inductor elements, and in which a characteristic impedance in a differential mode of the first differential transmission line and a characteristic impedance
(Continued)

in the differential mode of the second differential transmission line are substantially equivalent, and a characteristic impedance in an in-phase mode of the second differential transmission line is higher than a characteristic impedance in the in-phase mode of the first differential transmission line.

10 Claims, 12 Drawing Sheets

(58) Field of Classification Search
CPC . H04B 3/04; H04B 3/14; H04B 3/146; H04B 2203/54; H04B 2203/5416; H04B 2203/5462; H04B 2203/547
See application file for complete search history.

(56) References Cited

U.S. PATENT DOCUMENTS

| | | | | |
|---|---|---|---|---|
| 10,333,742 B1* | 6/2019 | Bhagwat | ............. | H04L 25/0298 |
| 10,444,823 B2* | 10/2019 | Gardner | ................ | G06F 1/3287 |
| 10,447,959 B2* | 10/2019 | Hu | ................ | H05K 3/4007 |
| 11,277,581 B2* | 3/2022 | Hu | ............. | H04N 5/38 |
| 11,444,657 B2* | 9/2022 | Uematsu | ............. | H04L 25/0276 |
| 12,080,933 B2* | 9/2024 | Uematsu | ............. | H05K 1/025 |
| 12,119,800 B2* | 10/2024 | Uematsu | ............. | H03H 7/0153 |
| 12,119,964 B2* | 10/2024 | Ikeda | ................ | H04L 25/03878 |
| 12,187,204 B2* | 1/2025 | Kogo | ................ | B60R 16/023 |
| 2001/0013075 A1* | 8/2001 | Otsuka | ................ | G06F 13/4072 |
| | | | | 710/33 |
| 2005/0164666 A1* | 7/2005 | Lang | ................ | H04B 1/7163 |
| | | | | 455/523 |
| 2007/0052492 A1* | 3/2007 | Duan | ................ | H01P 11/007 |
| | | | | 333/33 |
| 2008/0250373 A1* | 10/2008 | Bird | ................ | H05K 1/113 |
| | | | | 716/125 |
| 2009/0263140 A1* | 10/2009 | Kagaya | ................ | H05K 1/0253 |
| | | | | 398/139 |
| 2010/0182724 A1* | 7/2010 | Ito | ................ | H03H 7/427 |
| | | | | 361/56 |
| 2010/0283557 A1* | 11/2010 | Taniguchi | ............. | H03H 7/0115 |
| | | | | 333/204 |
| 2013/0038413 A1* | 2/2013 | Wu | ................ | H01P 3/02 |
| | | | | 333/204 |
| 2013/0098671 A1* | 4/2013 | Thurairajaratnam | .. | H05K 1/024 |
| | | | | 174/266 |
| 2013/0124763 A1* | 5/2013 | Kessler | ................ | G06F 11/0754 |
| | | | | 710/110 |
| 2013/0301745 A1* | 11/2013 | Maniktala | ............. | H04L 12/10 |
| | | | | 375/258 |
| 2015/0222125 A1* | 8/2015 | Brunker | ............. | H01R 13/6633 |
| | | | | 307/42 |
| 2015/0295735 A1* | 10/2015 | Gardner | ............. | G06F 13/4072 |
| | | | | 307/1 |
| 2016/0054777 A1* | 2/2016 | Dwelley | ................ | G06F 1/3287 |
| | | | | 710/110 |
| 2016/0308683 A1* | 10/2016 | Pischl | ................ | H04L 12/10 |
| 2017/0187472 A1* | 6/2017 | Chini | ................ | H04B 15/005 |
| 2018/0024620 A1* | 1/2018 | Gardner | ............. | H04L 12/40045 |
| | | | | 713/323 |
| 2019/0103682 A1* | 4/2019 | Thai | ................ | H01Q 9/28 |
| 2019/0158773 A1* | 5/2019 | Hu | ................ | H05K 3/4007 |
| 2020/0014875 A1* | 1/2020 | Hu | ................ | H05K 3/4007 |
| 2020/0092014 A1* | 3/2020 | de Rochemont | ........ | H03H 7/06 |
| 2021/0082609 A1* | 3/2021 | Carrizales | ............. | H02M 1/126 |
| 2022/0094028 A1* | 3/2022 | Uematsu | ................ | H01P 1/2039 |
| 2022/0190874 A1* | 6/2022 | Uematsu | ............. | H04L 25/03885 |
| 2022/0248575 A1* | 8/2022 | Toyama | ............. | H05K 9/0033 |
| 2022/0278665 A1* | 9/2022 | Uematsu | ............. | B60R 16/023 |
| 2023/0031292 A1* | 2/2023 | Nakamura | ........... | H05K 9/0018 |
| 2023/0166678 A1* | 6/2023 | Kogo | ................ | B60R 16/023 |
| | | | | 307/10.1 |
| 2023/0239182 A1* | 7/2023 | Ikeda | ................ | H04B 3/04 |
| | | | | 375/229 |
| 2023/0402793 A1* | 12/2023 | Huang | ................ | H05K 1/0233 |
| 2023/0412209 A1* | 12/2023 | Uematsu | ............. | G07C 5/0816 |
| 2024/0235900 A1* | 7/2024 | Wachi | ................ | H05K 1/0245 |

* cited by examiner freq(1.000MHz to 5.000GHz)

m2
freq = 2.506GHz
S(3,3)=0.969 / -0.057
impedance = Z0*(63.934-j2.030)

freq(1.000MHz to 5.000GHz)

m1
freq = 2.506GHz
dB(S(4,3))=-12.176

DIFFERENTIAL TRANSMISSION SUBSTRATE AND POWER-OVER-DIFFERENTIAL DATA COMMUNICATION DEVICE

TECHNICAL FIELD

The present invention relates to a differential transmission board and a power superposition differential data communication device, and particularly relates to an effective technology applied to a differential transmission board and a power superposition differential data communication device that superimpose power on a differential data transmission line between an electronic control unit (ECU) and an ECU and between an ECU and a sensor in an automobile.

BACKGROUND ART

Sensors such as a radar, LiDAR (Light Detection and Ranging or Laser Imaging Detection and Ranging), and a camera for sensing a situation of the outside world for automated driving of automobiles have increased in automobiles, and an electronic control unit (ECU) that receives data sensed by these sensors and performs signal processing, and a data transmission amount between an ECU and an ECU have dramatically increased. In addition, the number of power supply cables for supplying power to the increased sensors is also increased.

On the other hand, in order to cope with these increased data transmission amounts, standardization for applying Ethernet communication (Ethernet: registered trademark) for vehicles is in progress. In this in-vehicle Ethernet standard, by superimposing DC power on a differential transmission line called a power over data line (PoDL), a function capable of supplying power to a sensor or an ECU in accordance with data transmission is also incorporated, and the number of power supply cables for supplying power to the increased sensors can be reduced.

As an in-vehicle Ethernet standard to which the PODL is applicable, 1000 BASE-T1 capable of transmitting 1 Gbps of data has completed establishment of the standard in 2016. As of 2021, 2.5 GBASE-T1, 5.0 GBASE-T1, and 10 GBASE-T1, which enable multi-gigabit data transmission of 2.5 Gbps, 5.0 Gbps, and 10 Gbps, are under standardization.

PTL 1 (JP 2019-47165 A) has been proposed as a differential communication device that performs communication using a differential signal on which DC power is superimposed. PTL 1 discloses the differential communication device capable of superimposing the DC power on the differential signal while maintaining immunity performance (noise resistance). That is, a differential communication device that performs communication using a differential signal on which DC power is superimposed includes a connector connected to an external signal line that transmits the differential signal, a common-mode choke coil provided on a pair of signal lines connecting a communication circuit that performs the communication and the connector, a power circuit that supplies or receives the DC power superimposed on the differential signal, and a pair of regulator circuits provided between the communication circuit and the common-mode choke coil corresponding to each of the pair of signal lines and including a capacitive element connected between the communication circuit and the common-mode choke coil, and an inductive element connected between the power circuit and the common-mode choke coil. In PTL 1, when common mode noise is input to the common-mode choke coil, magnetic fluxes generated in a pair of coils of the common-mode choke coil intensify each other, and the common-mode choke coil generates a high impedance to prevent passage of the common mode noise. On the other hand, when the differential signal is input to the common-mode choke coil, the magnetic flux generated in the pair of coils is canceled, and the common-mode choke coil does not generate a high impedance and allows the differential signal to pass.

CITATION LIST

Patent Literature

PTL 1: JP 2019-47165 A

SUMMARY OF INVENTION

Technical Problem

In power superposition differential data transmission using the PoDL, a UTP cable (Unshielded Twisted Pair Cable) or an STP cable (Shielded Twisted Pair Cable) is used for transmission between modules in the standard. In the PoDL, there is a problem that in-phase noise generated in a transmission/reception IC (IC: semiconductor integrated circuit device) mounted on a differential transmission board of a module and in-phase noise jumping to the differential transmission board are radiated from the UTP cable.

The present inventors have studied a differential transmission board used in a power superposition differential data communication device. As a result of this study, it has been found that it is effective to implement the common-mode choke coil in order to reduce radiation noise of the common-mode noise (in-phase noise), and it is possible to attenuate only an in-phase mode in which the in-phase noise is transmitted without attenuating a signal of a differential mode in which a data signal is transmitted, and to reduce the amount of radiation from the UTP cable.

However, in a case where an electronic control unit (ECU) and an ECU and an ECU and a sensor in an automobile are connected by power superposition differential data transmission for automatic driving of the automobile, since a power superposition differential data communication device is provided in each ECU and each sensor, the number of power superposition differential data communication devices also increases. Therefore, it is also important that the differential transmission board used in the power superposition differential data communication device is configured at low cost by reducing the number of components as much as possible. In addition, the present inventors have also found that, in the differential transmission board on which a capacitor element and an inductor element forming a filter for separating a differential data signal and DC power are mounted, there is a problem that reflection characteristics at a radio frequency are deteriorated due to a parasitic capacitance component (a parasitic capacitance component between the capacitor element and a ground wiring and a parasitic capacitance component between the inductor element and the ground wiring) affected by a foot pattern (that is, layout arrangement (pattern) of the ground wiring) of the differential transmission board.

An object of the present invention is to provide a technique of power superposition differential data transmission with low radiation noise at low cost and capable of operating at a radio frequency.

The foregoing and other objects and novel features of the present invention will become apparent from the description of the present specification and the accompanying drawings.

Solution to Problem

An outline of representative ones of the present invention will be briefly described as follows.

That is, a differential transmission board superimposes DC power on a differential data signal from a transmission/reception IC and then transmits the signal to a cable, and includes: a first differential transmission line including two wiring patterns; a second differential transmission line including two wiring patterns; two DC transmission lines that transmit the DC power; two capacitor elements that cut off the DC power and pass only the differential data signal; and two inductor elements that cut off a radio-frequency component that is the differential data signal and pass only a DC component, in which the first differential transmission line and the second differential transmission line are connected in series, in which the two capacitor elements are connected in series to the second differential transmission line, in which the second differential transmission line and the DC transmission line are connected via the two inductor elements, and in which a characteristic impedance in a differential mode of the first differential transmission line and a characteristic impedance in the differential mode of the second differential transmission line are substantially equivalent, and a characteristic impedance in an in-phase mode of the second differential transmission line is higher than a characteristic impedance in the in-phase mode of the first differential transmission line.

Advantageous Effects of Invention

According to the above, it is possible to provide a technique of power superposition differential data transmission with low radiation noise at low cost and capable of operating at a radio frequency.

Problems, configurations, and effects other than those described above will become apparent from the following description of embodiments for carrying out the invention.

DESCRIPTION OF EMBODIMENTS

Figure 1A:
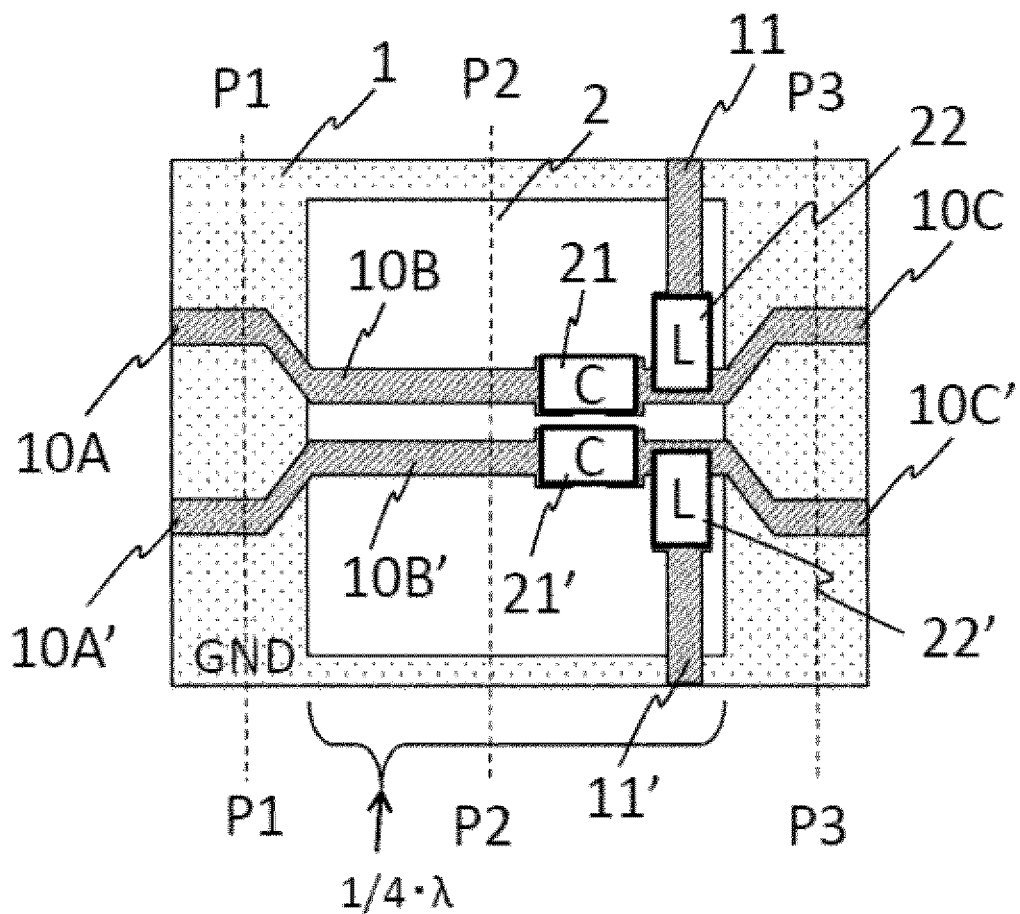
FIG. 1A is a plan view illustrating an arrangement of a differential transmission board and a mounted element constituting a power superposition differential data communication device according to a first embodiment.

Hereinafter, embodiments of the present invention will be described with reference to the drawings. The embodiments or the examples are examples for describing the present invention, and omission and simplification are appropriately made for clarity of description. The present invention can be implemented in various other forms. Unless otherwise specified, each component may be singular or plural.

Positions, sizes, shapes, ranges, and the like of the components illustrated in the drawings may not represent actual positions, sizes, shapes, ranges, and the like in order to facilitate understanding of the invention. Therefore, the present invention is not necessarily limited to the position, size, shape, range, and the like disclosed in the drawings.

In a case where there is a plurality of components having the same or similar functions, the same reference numerals may be attached with different subscripts for description. In addition, in a case where it is not necessary to distinguish the plurality of components, the description may be made by omitting the subscripts.

In all the drawings for describing the embodiments, the same components or the same members are denoted by the same reference numerals in principle, and repeated description thereof may be omitted. In order to make the description clearer, the drawings may be schematically illustrated as compared with the actual embodiment, but they are merely examples and do not limit the interpretation of the present invention.

First Embodiment

Hereinafter, a first embodiment will be described in detail with reference to the drawings. FIG. 1A is a plan view illustrating an arrangement of a differential transmission board and a mounted element constituting a power superposition differential data communication device according to the first embodiment.

Figure 1B:
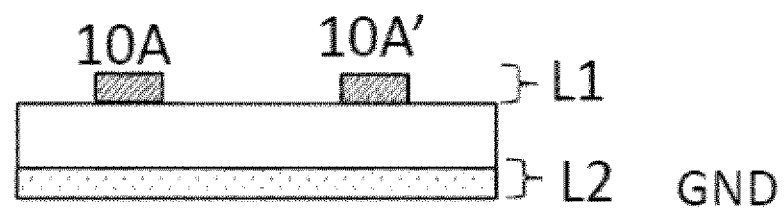
FIG. 1B is a cross-sectional view of the differential transmission board taken along line P1, P3 in FIG. 1A.
Figure 1C:
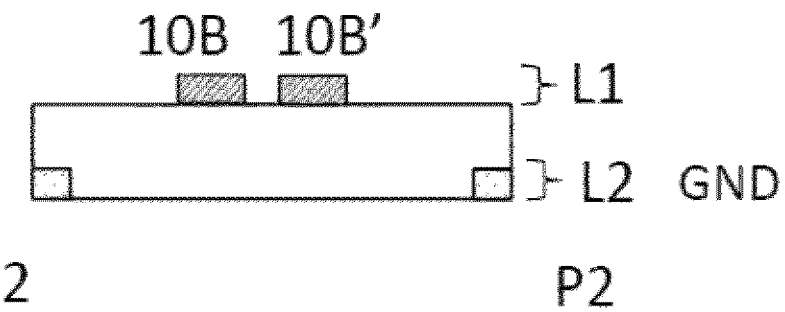
FIG. 1C is a cross-sectional view of the differential transmission board taken along line P2 in FIG. 1A.
Figure 1D:
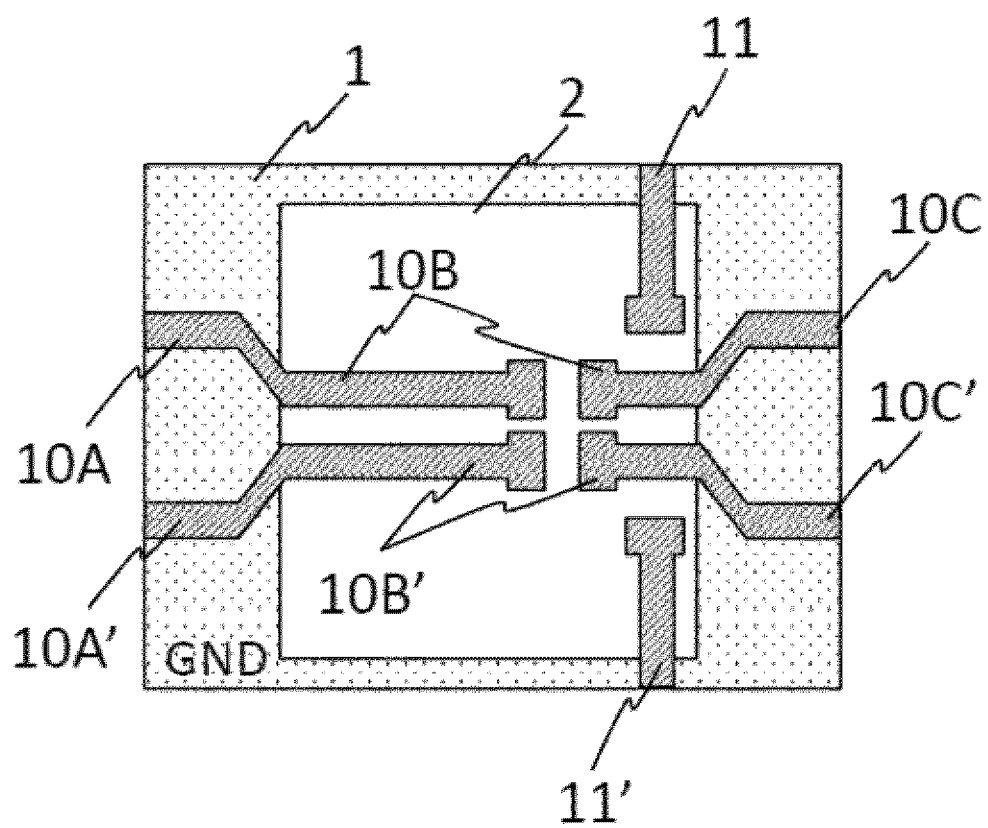
FIG. 1D is a plan view illustrating the differential transmission board in a case where a mounted element is deleted from FIG. 1A.

FIG. 1B is a cross-sectional view of the differential transmission board taken along line P1, P3 in FIG. 1A. FIG. 1C is a cross-sectional view of the differential transmission board taken along line P2 in FIG. 1A. FIG. 1D is a plan view illustrating the differential transmission board in a case where the mounted element is removed from FIG. 1A.

A differential transmission board 1 illustrated in FIG. 1A is a differential transmission board constituting a power superposition type differential data communication device (also referred to as a power superposition differential transmission communication device), and is a board that superimposes DC power on a differential data signal from a transmission/reception IC and then transmits the signal to a cable. As illustrated in FIGS. 1A and 1D, the differential transmission board 1 includes a first differential transmission line having a microstrip line structure including two wiring patterns 10A and 10A', a second differential transmission line having a microstrip line structure including two wiring patterns 10B and 10B' passing over a pattern of a region (also referred to as a GND opening) 2 from which a ground potential layer (also referred to as a GND layer) to which a ground potential is supplied is deleted, and a differential transmission line having a microstrip line structure including two wiring patterns 10C and 10C', similarly to the two wiring patterns 10A and 10A'. The transmission/reception IC is configured to be connected to the first differential transmission line (10A, 10A'), and the two wiring patterns 10C and 10C' are configured to be connected to the cable. As a result, the differential data signal output from the transmission/reception IC is transmitted to the cable via the first differential transmission line (10A, 10A'), the second differential transmission line (10B, 10B'), and the two wiring patterns 10C and 10C', and the differential data signal transmitted from the cable is transmitted to the transmission/reception IC via the two wiring patterns 10C and 10C', the second differential transmission line (10B, 10B'), and the first differential transmission line (10A, 10A').

The differential transmission board 1 further includes two DC transmission lines 11 and 11' that transmit DC power, two capacitor elements 21 and 21' that cut off DC power and pass only a high-speed data signal, and two inductor elements 22 and 22' that cut off a radio-frequency component that is a differential data signal and pass only a DC component.

As illustrated in FIGS. 1A and 1D, the first differential transmission line (10A, 10A') and the second differential transmission line (10B, 10B') are connected in series. The capacitor element 21, 21' is connected in series to the second differential transmission line (10B, 10B'). The second differential transmission line (10B, 10B') and the DC transmission line (11, 11') are connected via the inductor element 22, 22'. In addition, the second differential transmission line (10B, 10B') and the two wiring patterns 10C and 10C' are connected in series.

The differential transmission line including the two wiring patterns 10C and 10C' can also be referred to as a first differential transmission line. That is, in the configuration example of the differential transmission board 1 illustrated in FIGS. 1A and 1D, the second differential transmission line (10B, 10B') is formed between the first differential transmission line (10A, 10A') and the first differential transmission line (10C, 10C'). The first differential transmission line (10A, 10A') and the first differential transmission line (10C, 10C') are formed on a region where the GND layer is formed in plan view. On the other hand, the second differential transmission line (10B, 10B') is formed on a region 2 from which the GND layer is deleted in plan view.

The characteristic impedance in the differential mode of the first differential transmission line (10A, 10A', 10C, 10C') is substantially equivalent to the characteristic impedance in the differential mode of the second differential transmission line (10B, 10B'). On the other hand, the characteristic impedance in the in-phase mode of the second differential transmission line (10B, 10B') is higher than the characteristic impedance in the in-phase mode of the first differential transmission line (10A, 10A', 10C, 10C').

Here, FIG. 1B illustrates a cross-sectional structure of the first differential transmission line (a portion indicated by line P1, P3 in FIG. 1A). FIG. 1C illustrates a cross-sectional structure of the second differential transmission line (a portion indicated by line P2 in FIG. 1A).

The first differential transmission line (10A, 10A', 10C, 10C') uses a first wiring layer L1 as a signal line (10A, 10A', 10C, 10C') and a second wiring layer L2 as a ground potential layer (also referred to as a GND layer or a GND plane), and is a so-called microstrip line in which the characteristic impedance is determined by the wiring width of the first wiring layer L1, the insulator thickness and the dielectric constant between the first wiring layer L1 and the second wiring layer L2. Therefore, the first differential transmission line (10A, 10A', 10C, 10C') has a feature that the characteristic impedance in the differential mode and the characteristic impedance in the in-phase mode are substantially equivalent.

On the other hand, in the differential transmission line (10B, 10B'), the first wiring layer L1 is used as the signal line 10B, 10B' similarly to the first differential transmission line (10A, 10A', 10C, 10C'), but the GND plane of the second wiring layer L2 below the signal line (10B, 10B') is deleted. That is, the GND plane immediately below the second differential transmission line (10B, 10B') or a pattern equivalent thereto is removed. As a result, the characteristic impedance in the differential mode of the second differential transmission line (10B, 10B') is determined by the distance between the differential wirings of the wiring patterns 10B and 10B' and the dielectric constant of the first wiring layer L1. On the other hand, since the impedance in the in-phase mode of the second differential transmission line (10B, 10B') is still determined by the distance between the signal line (10B, 10B') of the first wiring layer L1 and the GND layer of the second wiring layer L2 far away, the impedance in the in-phase mode of the second differential transmission line (10B, 10B') can be higher than the characteristic impedance in the in-phase mode of the first differential transmission line (10A, 10A', 10C, 10C'). As described above, by having the differential transmission board 1 including at least one differential transmission line (second differential transmission line) having a high characteristic impedance in the in-phase mode, reflection in the in-phase mode can be increased. As a result, in the differential transmission board 1 of the first embodiment, it is possible to reduce the in-phase noise without inserting a common-mode choke coil. That is, it is possible to provide the differential transmission board 1 for power superposition differential data transmission that can reduce the number of components, reduce radiation noise, and operate at a radio frequency at low cost.

Figure 7A:
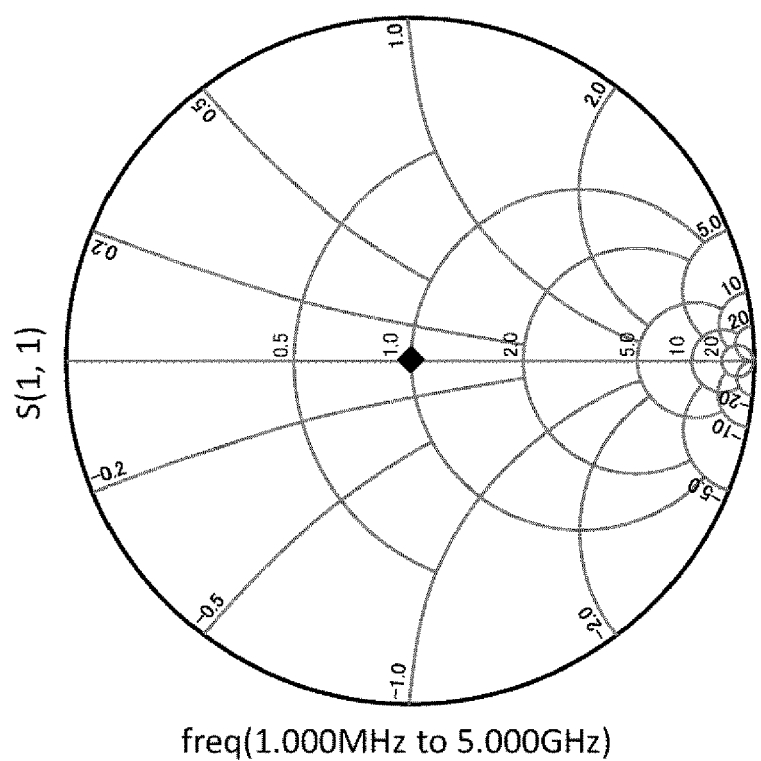
FIG. 7A is a Smith chart illustrating reflection characteristics in a differential mode of the differential transmission board according to the first embodiment.
Figure 7B:
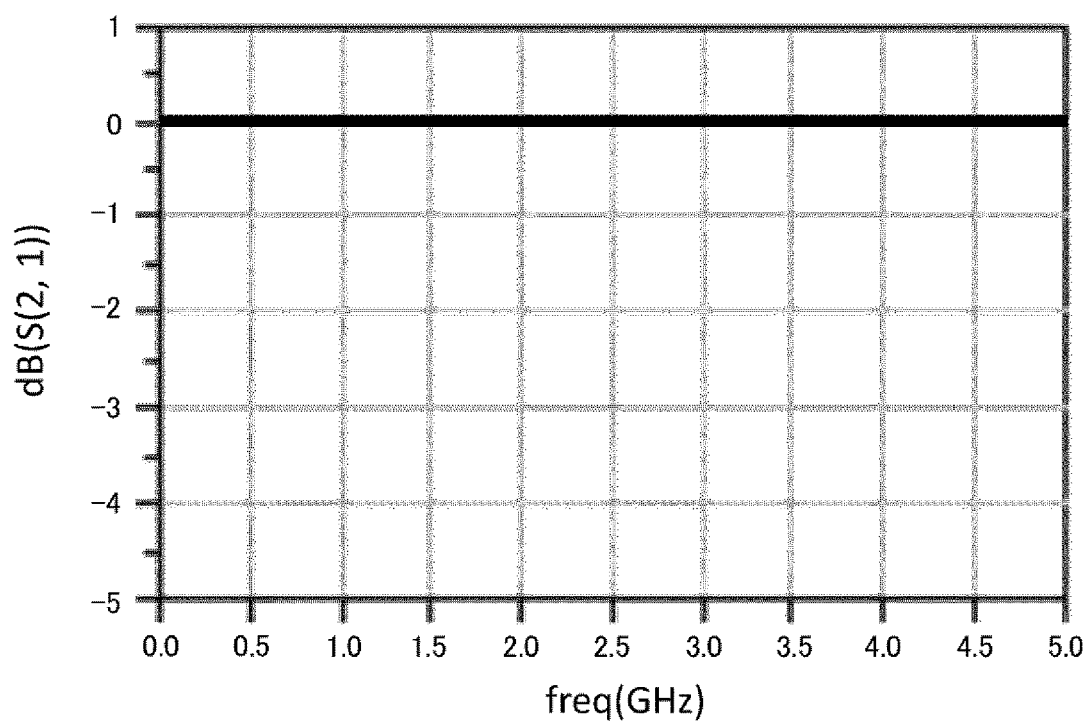
FIG. 7B is a graph illustrating transmission characteristics in the differential mode of the differential transmission board according to the first embodiment.
Figure 7C:
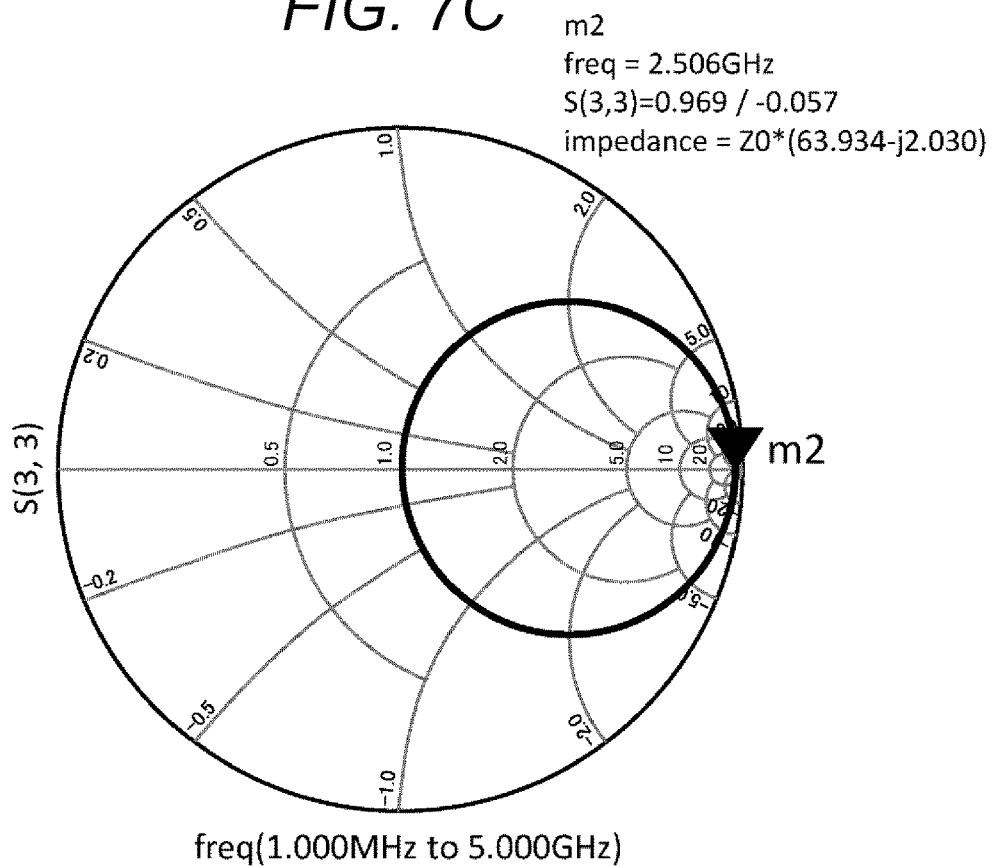
FIG. 7C is a Smith chart illustrating reflection characteristics in an in-phase mode of the differential transmission board according to the first embodiment.
Figure 7D:
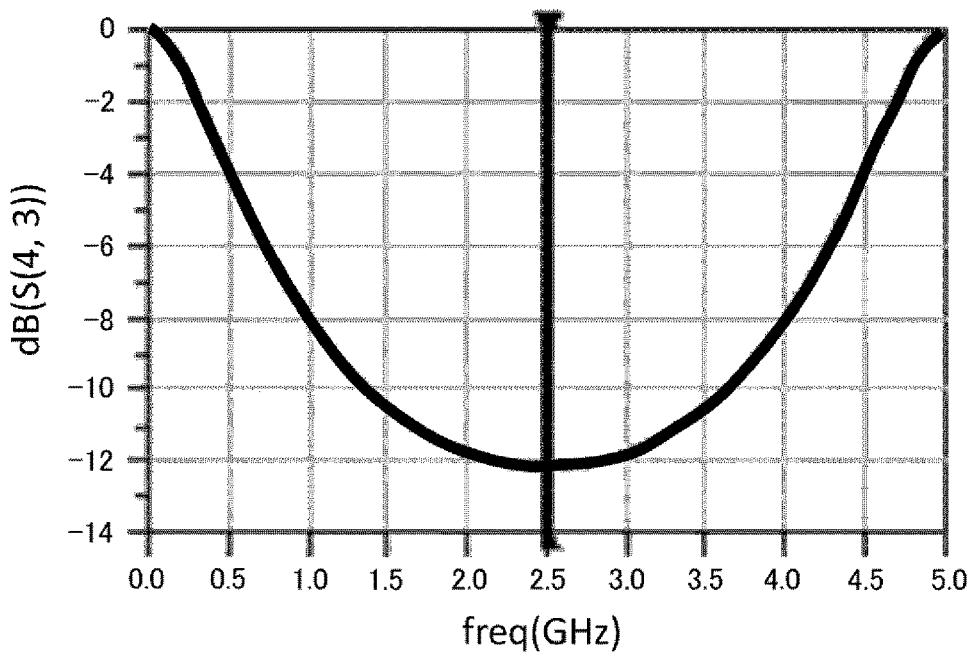
FIG. 7D is a graph illustrating transmission characteristics in the in-phase mode of the differential transmission board according to the first embodiment.

Simulation results of the differential transmission board according to the first embodiment will be described with reference to FIGS. 7A to 7D. FIG. 7A is a Smith chart illustrating reflection characteristics in the differential mode. FIG. 7B is a graph illustrating transmission characteristics in the differential mode. FIG. 7C is a Smith chart illustrating reflection characteristics in the in-phase mode. FIG. 7D is a graph illustrating transmission characteristics in the in-phase mode.

FIGS. 7A to 7D illustrate simulation results of a single differential transmission line that is an ideal lossless transmission line and has a characteristic impedance in a differential mode of 50Ω (differential 100Ω), a characteristic impedance in an in-phase mode of 200Ω, and an electrical length of ¼ wavelength at a frequency of 2.5 GHZ. As can be seen from the reflection characteristics (Smith chart) of the differential mode in FIG. 7A and the transmission characteristics of the differential mode in FIG. 7B, ideal transmission characteristics of low reflection and low attenuation characteristics can be obtained for the differential mode in which the data signal is transmitted, and as can be seen from the in-phase mode reflection characteristics (Smith chart) in FIG. 7C and the transmission characteristics of the in-phase mode in FIG. 7D, it can be confirmed that ideal characteristics for noise elimination such as large reflection and strong attenuation characteristics are be obtained for the in-phase mode in which the in-phase noise is transmitted.

As can be seen from FIG. 7D, the attenuation amount of the in-phase mode is the largest at 2.5 GHZ. This is because, as illustrated in FIG. 7C, when the electrical length of the transmission line is ¼ wavelength (λ) at 2.5 GHZ, the impedance becomes the largest and the reflection amount becomes the largest. That is, this means that the impedance is maximized under the condition that the line length of the second differential transmission line (10B, 10B') configured in the differential transmission board 1 in the present invention is ¼ wavelength with respect to the frequency of interest (for example, the frequency of the noise to be most desirably removed). The frequency of 2.5 GHZ is the Nyquist frequency of the transmission data in 10 GBASE-T1. The line length (electrical length: ¼·λ) of the second differential transmission line (10B, 10B') is about 2 cm when the frequency of the differential data transmission is 2.5 GHz as illustrated in FIG. 1A.

Figure 2A:
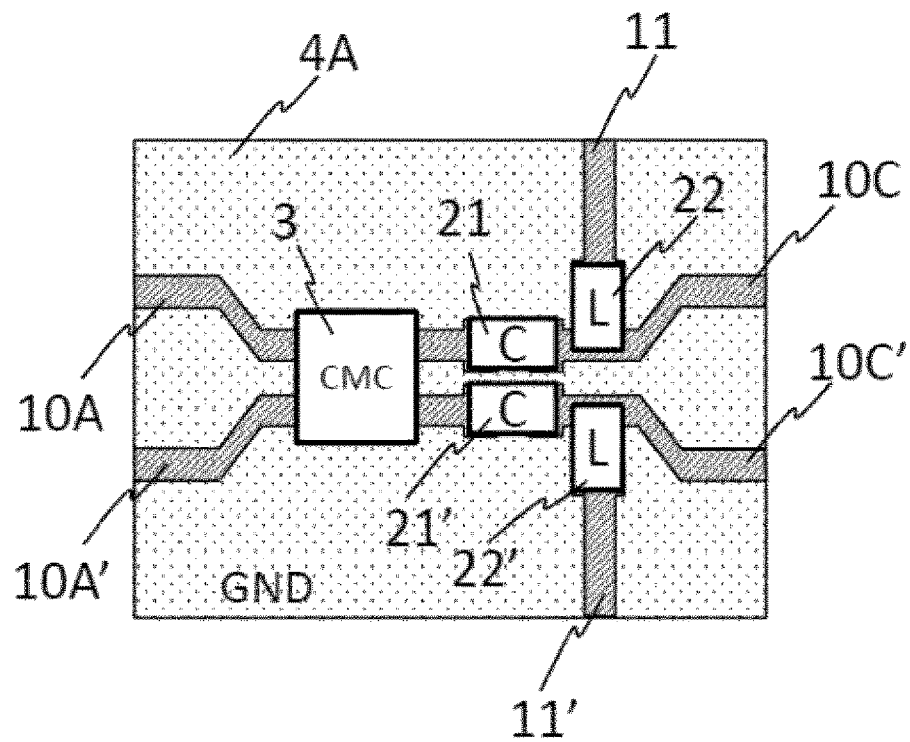
FIG. 2A is a view illustrating a differential transmission board according to Comparative Example 1.
Figure 2B:
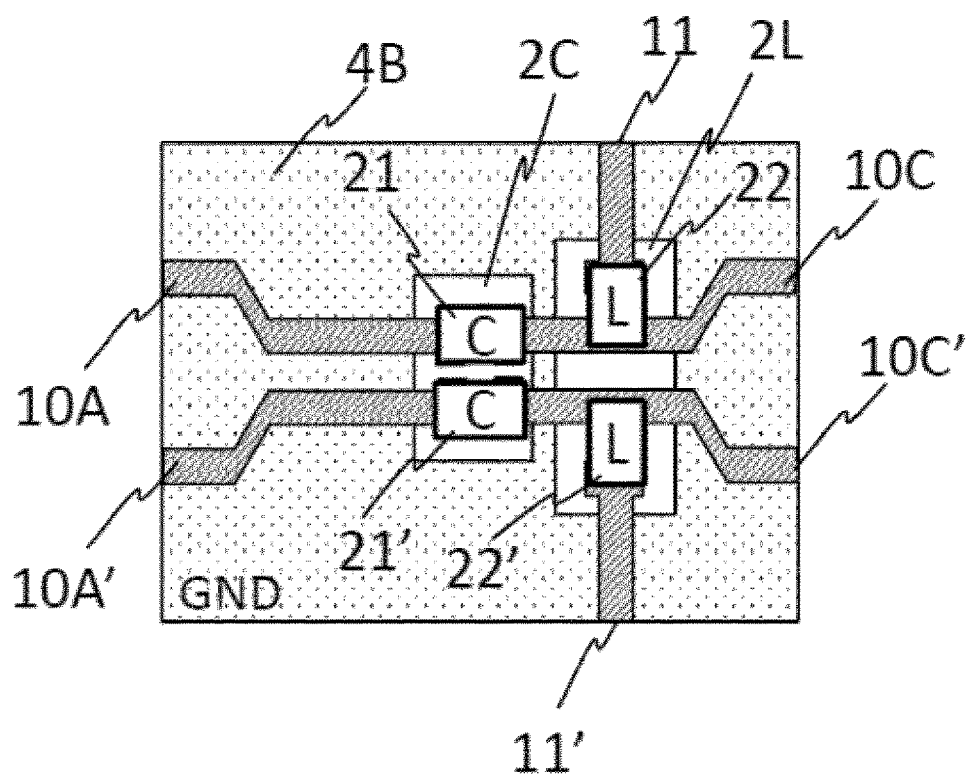
FIG. 2B is a view illustrating a differential transmission board according to Comparative Example 2.
Figure 2C:
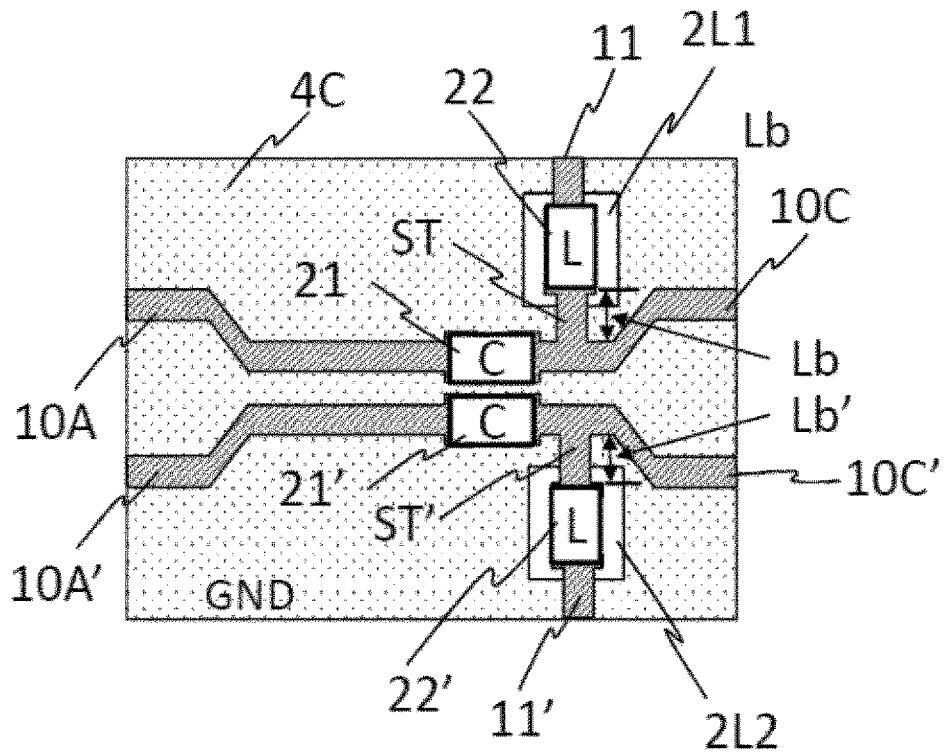
FIG. 2C is a view illustrating a differential transmission board according to Comparative Example 3.

Next, another advantage of the differential transmission board 1 in the present invention will be described using comparative examples of FIGS. 2A to 2C. Differential transmission boards according to Comparative Examples 1 to 3 illustrated in FIGS. 2A to 2C are differential transmission boards studied by the inventor, and are not a known configuration of the differential transmission board. FIG. 2A is a differential transmission board according to Comparative Example 1, and illustrates a configuration example of a differential transmission board using a common-mode choke coil. FIG. 2B illustrates a configuration example of a differential transmission board according to Comparative Example 2 in which a GND layer is removed only at a place where a capacitor element and an inductor element are mounted and disposed. FIG. 2C illustrates a configuration example of a differential transmission board according to Comparative Example 3 in which an inductor element is moved to an upper side of a DC power transmission line and then a GND layer is removed in order to reduce the influence of the removal of the GND layer of the inductor element.

As illustrated in FIG. 2A, a differential transmission board 4A is an example of a differential transmission board in a power superposition differential data communication device using a common-mode choke coil. Here, the capacitor element 21, 21' and the inductor element 22, 22' are mounted in connection with the differential line 10A, 10A'. In this case, parasitic capacitive coupling occurs between the capacitor element 21, 21' and the GND plane (also referred to as a GND layer) and between the inductor element 22, 22' and the GND plane, which causes deterioration of radio-frequency transmission characteristics of the differential transmission board 4A.

As illustrated in FIG. 2B, a differential transmission board 4B is an example of a differential transmission board in which regions 2C and 2L are formed by removing the GND layer only at positions where the capacitor element 21, 21' and the inductor element 22, 22' are mounted and disposed. In this case, if the GND layer is simply removed, the characteristic impedance of the differential mode of the differential line 10A, 10A' increases, and impedance mismatching occurs, so that there is a problem that the differential transmission characteristics deteriorate. In particular, since a DC current of about 1 A at maximum flows through the inductor element used for PODL, the size of the inductor element 22, 22' increases, and the area of the region 2L where the GND layer is deleted at the place where the inductor element 22, 22' are mounted and disposed increases, so that the influence of impedance mismatching increases.

As illustrated in FIG. 2C, a differential transmission board 4C is an example of a differential transmission board in which the inductor element 22, 22' is moved to the upper side of the DC power transmission line (DC transmission line) 11, 11' and mounted and disposed in region 2L1, 2L2 from which the GND layer has been removed in order to reduce the influence of the deletion of the GND layer of the inductor element 22, 22'. This reduces the influence of the removal of the GND layer on the characteristic impedance of the differential mode of the differential line 10A, 10A'. However, between the differential line 10A and 10A' (10C and 10C') and the DC power transmission lines 11 and 11', two transmission lines ST and ST' having constant line lengths Lb and Lb' extending from the differential lines 10A and 10A' (10C and 10C') and the inductor elements 22 and 22' connected to the transmission lines ST and ST' are connected. Therefore, the wiring ST, ST' of this portion appear as an open stub at a radio frequency. Therefore, the radio-frequency transmission characteristics of the differential transmission board 4C deteriorate at the high frequency at which data transmission is performed. These effects become more significant in standards such as 2.5 GBASE-T1, 5.0 GBASE-T1, and 10 GBASE-T1 that enable multi-gigabit data transmission. That is, in the differential transmission board 4C of the comparative example, it is difficult to realize PoDL in multi-gigabit transmission.

However, in the differential transmission board 1 of FIG. 1 in the present invention, the capacitor element 21, 21' and the inductor element 22, 22' are mounted and disposed on the second differential transmission line 10B, 10B' on the region 2 in which the impedance matching of the differential mode is achieved and the GND layer is removed. Therefore, by deleting the capacitor element 21, 21' and the GND plane around the inductor element 22, 22' without impedance mismatching, it is possible to obtain an effect of obtaining radio-frequency characteristics by eliminating the influence of parasitic capacitance. That is, the configuration of the present invention is a technology of a differential transmission board that has not only an effect of reducing noise in the in-phase mode but also an effect of improving radio-frequency characteristics, and is useful for realizing a PoDL type differential data transmission device or differential data communication device for multi-gigabit data transmission.

Figure 8A:
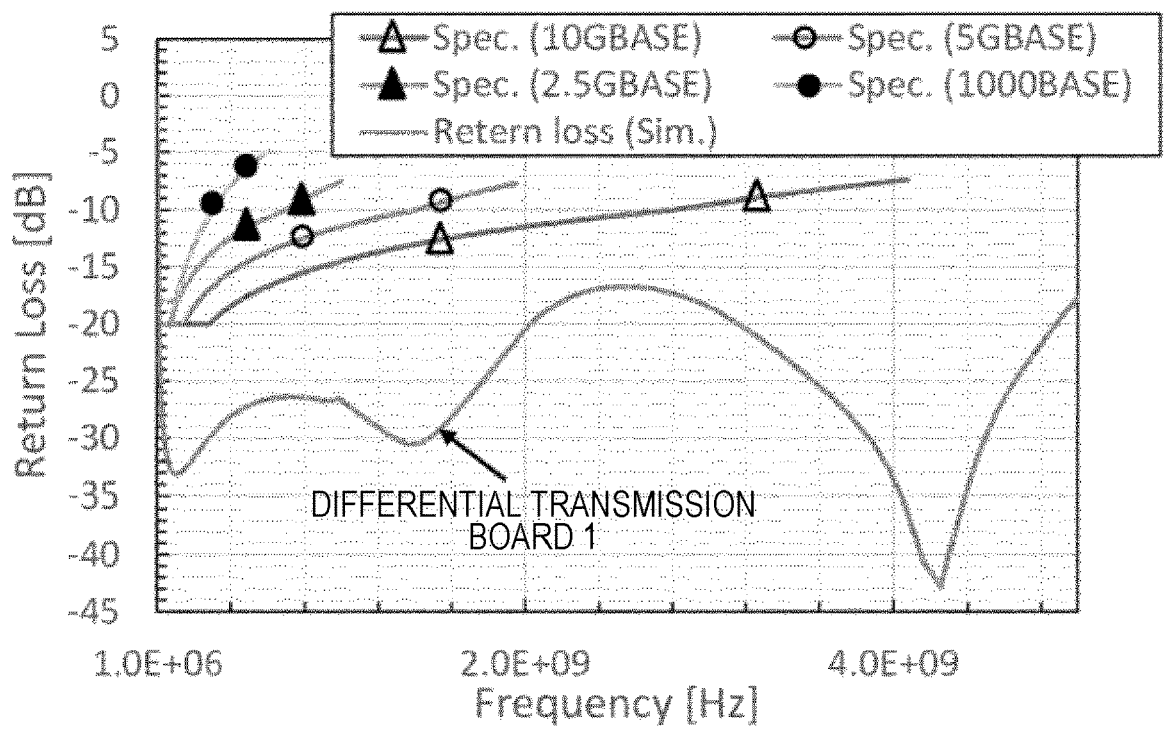
FIG. 8A is a simulation result illustrating the reflection characteristics in the differential mode of the differential transmission board according to the first embodiment.
Figure 8B:
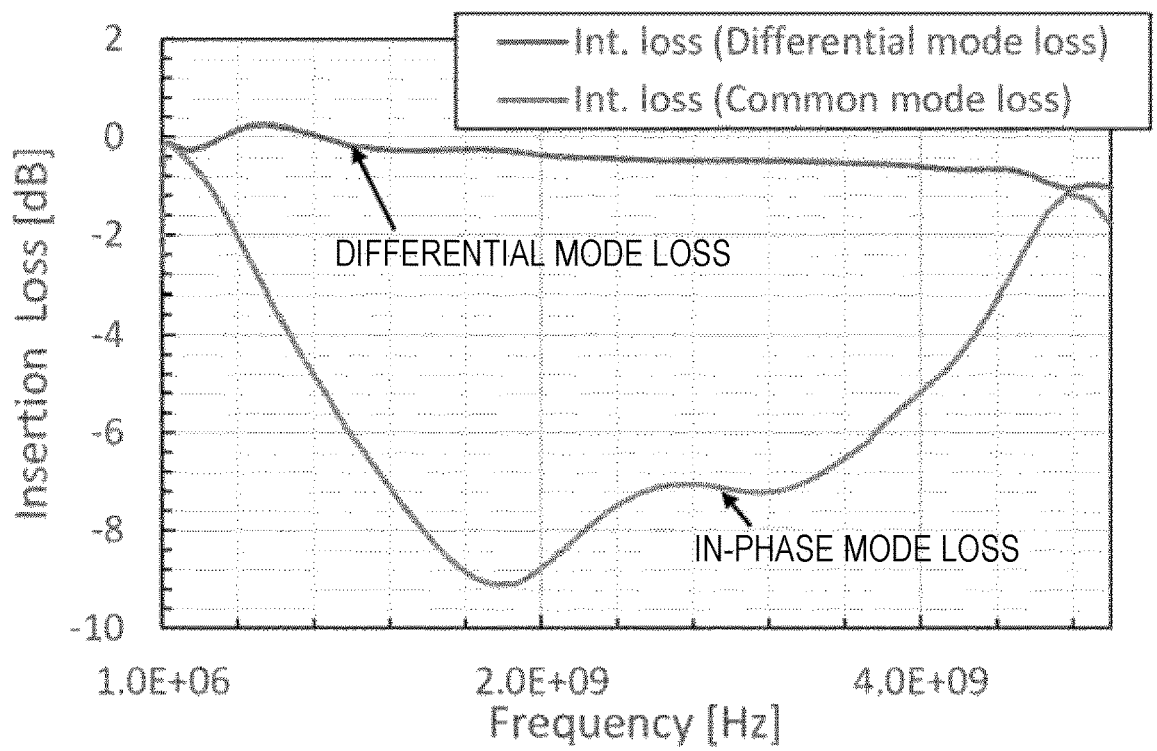
FIG. 8B is a simulation result illustrating transmission loss characteristics in the differential mode of the differential transmission board according to the first embodiment.

Next, simulation results the transmission of characteristics of the differential transmission board 1 of FIG. 1A will be described with reference to FIGS. 8A and 8B. FIG. 8A is a simulation result illustrating reflection characteristics in the differential mode of the differential transmission board according to the first embodiment. FIG. 8B is a simulation result illustrating transmission loss characteristics of the differential transmission board according to the first embodiment. Here, in this simulation, in FIG. 1A, a differential signal system is used in which a differential signal is input from the first differential transmission line 10A, 10A' (left side), passes through the second differential transmission line 10B, 10B', and is output to the differential transmission line 10C, 10C' (right side). Note that the differential transmission line 10C, 10C' in FIG. 1A is a differential transmission line having the characteristic impedance in the in-phase mode lower than that of the second differential transmission line 10B, 10B', similarly to the first differential transmission line 10A, 10A'. In FIG. 1A, the first differential transmission line 10A, 10A' is connected to the left side of the second differential transmission the line 10B, 10B', and differential transmission line 10C, 10C' having the characteristic impedance in the in-phase mode lower than that of the second differential transmission line 10B, 10B' are connected to the right side of the second differential transmission line 10B, 10B' again.

As shown in the simulation result of the reflection characteristics in FIG. 8A, the differential transmission board 1 of the first embodiment satisfies the reflection characteristics defined by the standard. In addition, as the simulation result of the transmission characteristics in FIG. 8B, it can be confirmed that the transmission loss of the differential mode in which the data signal is transmitted is small and the transmission loss of the in-phase mode in which the in-phase noise is transmitted is large.

Figure 9A:
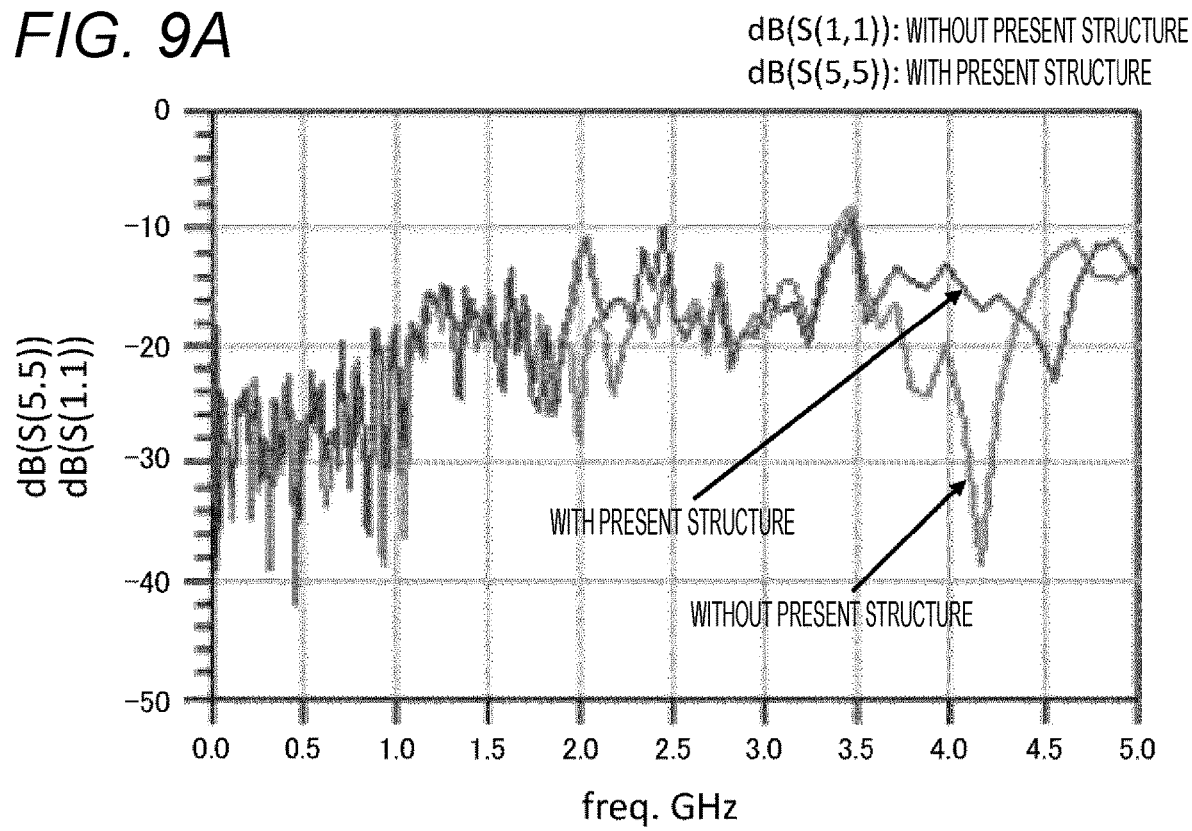
FIG. 9A is a graph illustrating reflection characteristics in the differential mode when a cable is connected to the differential transmission board according to the first embodiment.
Figure 9B:
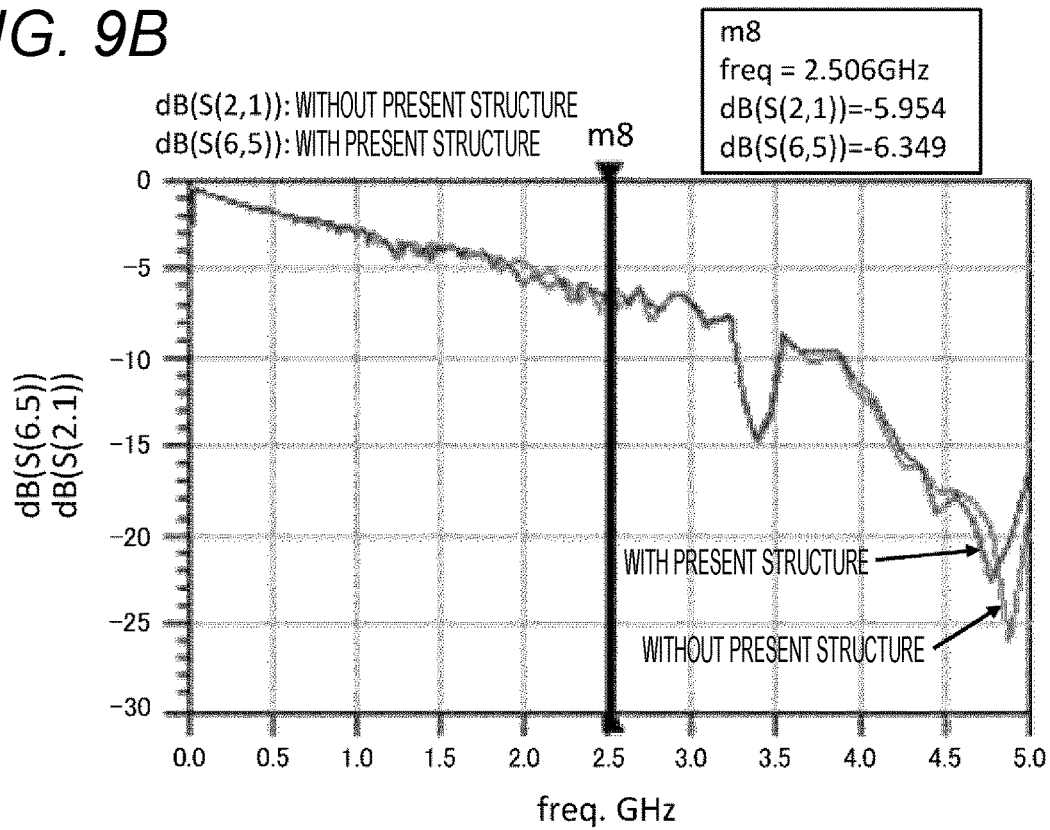
FIG. 9B is a graph illustrating transmission characteristics in the differential mode when the cable is connected to the differential transmission board according to the first embodiment.
Figure 9C:
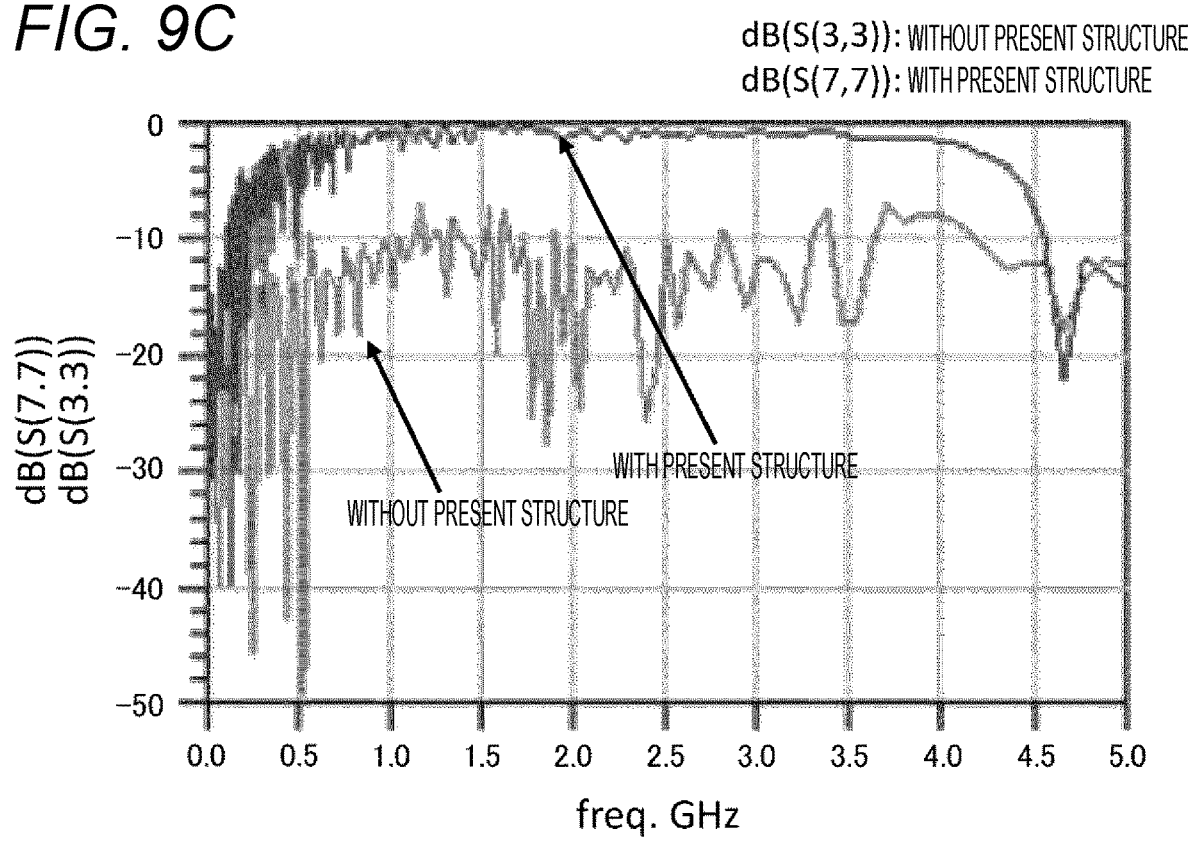
FIG. 9C is a graph illustrating reflection characteristics in the in-phase mode when the cable is connected to the differential transmission board according to the first embodiment.
Figure 9D:
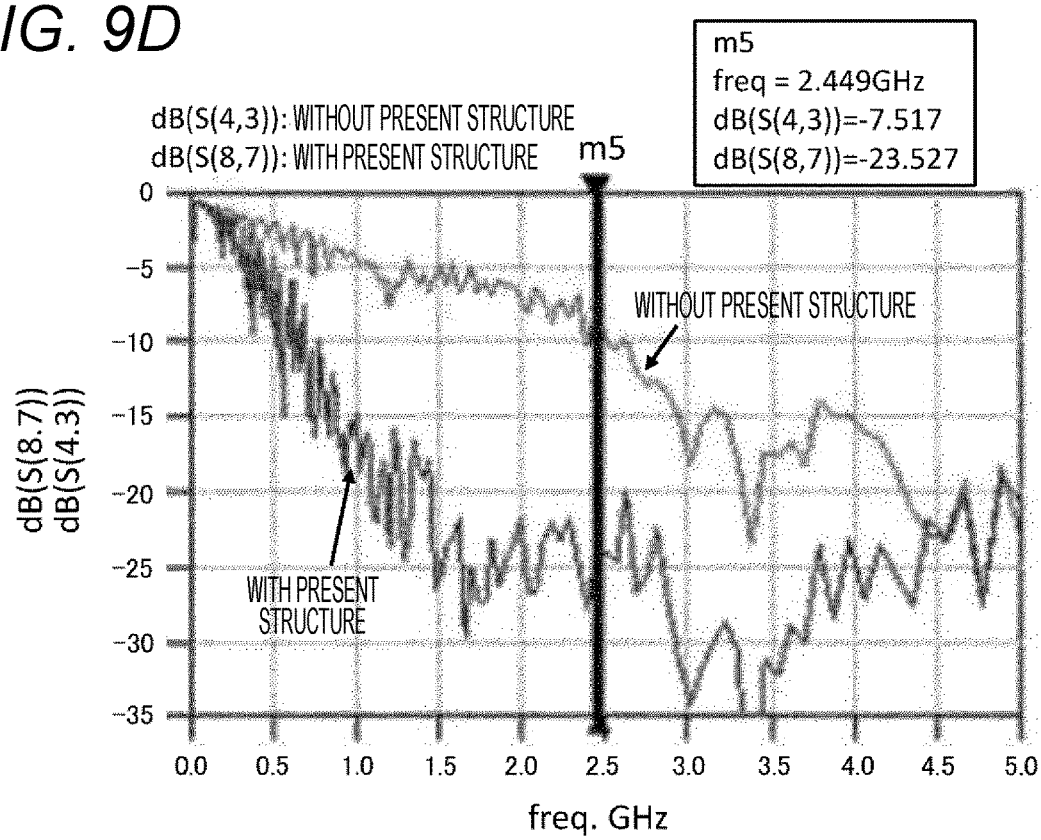
FIG. 9D is a graph illustrating transmission characteristics in the in-phase mode when the cable is connected to the differential transmission board according to the first embodiment.

An actual measurement result in a case where an UTP cable is connected to the differential transmission board 1 of the present invention will be described with reference to FIGS. 9A to 9D. FIG. 9A is a graph for explaining reflection characteristics in the differential mode. FIG. 9B is a graph illustrating transmission characteristics in the differential mode. FIG. 9C is a graph illustrating reflection characteristics in the in-phase mode. FIG. 9B is a graph illustrating transmission characteristics in the in-phase mode. In FIGS. 9A to 9D, "WITH PRESENT STRUCTURE" indicates an actual measurement result regarding the differential transmission board 1, and "WITHOUT PRESENT STRUCTURE" indicates an actual measurement result regarding the differential transmission board of the comparative example.

As can be seen from the reflection characteristics of the differential mode in FIG. 9A and the transmission characteristics of the differential mode in FIG. 9B, ideal transmission characteristics such as low reflection and low attenuation characteristics for the are obtained for the differential mode in which the data signal is transmitted in "WITH PRESENT STRUCTURE". As can be seen from the reflection characteristics of the in-phase mode in FIG. 9C and the transmission characteristics of the in-phase mode in FIG. 9D, it can be confirmed that ideal characteristics for noise elimination such as large reflection and strong attenuation characteristics are obtained for the in-phase mode in which the in-phase noise is transmitted in "WITH PRESENT STRUCTURE".

Second Embodiment

Figure 3:
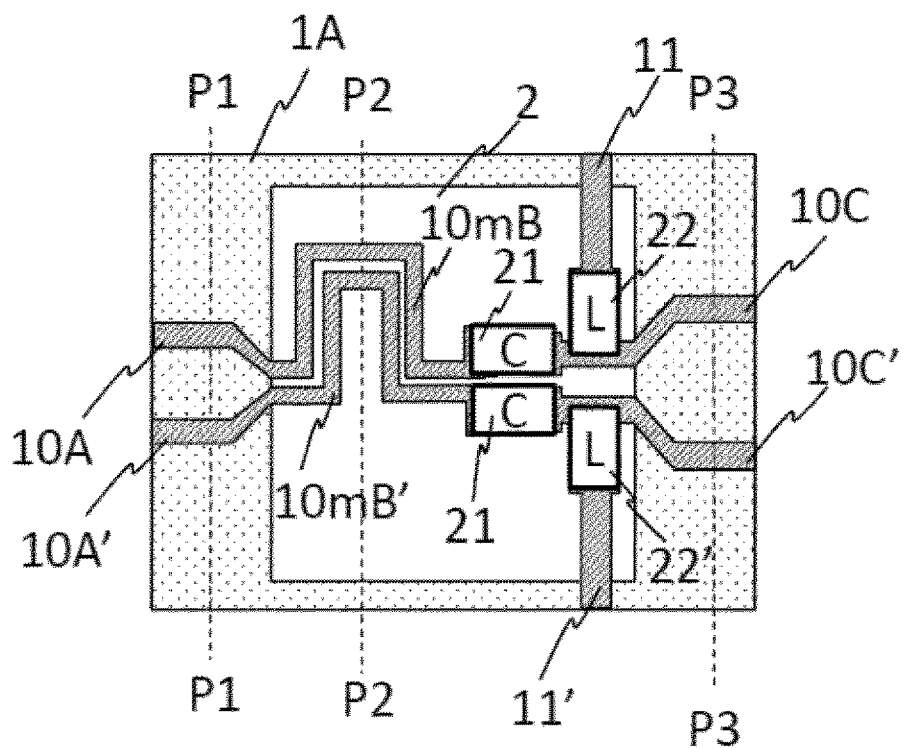
FIG. 3 is a view illustrating an arrangement of a differential transmission board and a mounted element constituting a power superposition differential data communication device according to a second embodiment.

Next, a differential transmission board 1A according to a second embodiment will be described with reference to FIG. 3. FIG. 3 is a view illustrating an arrangement of a differential transmission board and a mounted element constituting a power superposition differential data communication device according to the second embodiment. A difference between the differential transmission board 1A and the differential transmission board 1 of the first embodiment is that a second differential transmission line (10 mB, 10 mB') has a meander configuration in the differential transmission board 1A. Other configurations and effects of the differential transmission board 1A are the same as those of the differential transmission board 1. Since the second differential transmission line (10 mB, 10 mB') has the meander line structure, it is possible to realize the differential transmission board 1A with a small area while maintaining the electrical length of the second differential transmission line (10 mB, 10 mB') when the frequency of the differential data transmission is 2.5 GHZ. As a result, it is possible to provide the power superposition differential data communication device using the differential transmission board 1A having a low mounting area and a low cost.

Here, the cross-sectional structure taken along line P1, P3 illustrated in FIG. 3 is the same as the cross-sectional structure illustrated in FIG. 1B, and the cross-sectional structure taken along line P2 illustrated in FIG. 3 is basically the same as the cross-sectional structure illustrated in FIG. 1C.

As illustrated differential in FIG. 3, the transmission board 1A according to the second embodiment is a board that superimposes DC power on a differential data signal from a transmission/reception IC and then transmits the signal to a cable, and includes a first differential transmission line having a microstrip line structure including two wiring patterns 10A and 10A', a second differential transmission line including two wiring patterns 10 mB and 10 mB' passing over a pattern region 2 from which a GND layer is deleted and having a meander line structure, a differential transmission line having a microstrip line structure including two wiring patterns 10C and 10C', similarly to the two wiring patterns 10A and 10A', and two DC transmission lines 11 and 11' that transmit DC power. The differential transmission board 1A further includes two capacitor element 21, 21' that cut off DC power and pass only a high-speed data signal, and two inductor elements 22 and 22' that cut off a radio-frequency component that is a high-speed data signal and pass only a DC component.

As illustrated in FIG. 3, the first differential transmission line (10A, 10A') and the second differential transmission line (10 mB, 10 mB') are connected in series. The capacitor element 21, 21' is connected in series to the second differential transmission line (10 mB, 10 mB'). The second differential transmission line (10 mB, 10 mB') and the DC transmission line 11, 11' are connected via the inductor element 22, 22'. In addition, the second differential transmission line (10 mB, 10 mB') and the two wiring patterns 10C and 10C' are connected in series.

The characteristic impedance in the differential mode of the first differential transmission line (10A, 10A') is substantially equivalent to the characteristic impedance in the differential mode of the second differential transmission line (10 mB, 10 mB'), and the characteristic impedance in the in-phase mode of the second differential transmission line is (10A, 10A') higher than the characteristic impedance in the in-phase mode of the first differential transmission line (10 mB, 10 mB').

In the second embodiment, as illustrated in FIG. 3, since the differential transmission line 10 mB, 10 mB' having a high characteristic impedance in the in-phase mode have the meander configuration, it is possible to reduce the deletion area of the GND plane for forming the differential transmission line 10 mB, 10 mB', and there is an advantage that the structure of the present invention can be formed with a small board area. That is, it can be confirmed that, in the second embodiment, ideal transmission characteristics such as low reflection and low attenuation characteristics are obtained for the differential mode in which the data signal is transmitted without using the common-mode choke coil at lower cost, and ideal characteristics for noise elimination such as large reflection and strong attenuation characteristics are obtained for the in-phase mode in which the in-phase noise is transmitted.

Third Embodiment

Figure 4A:
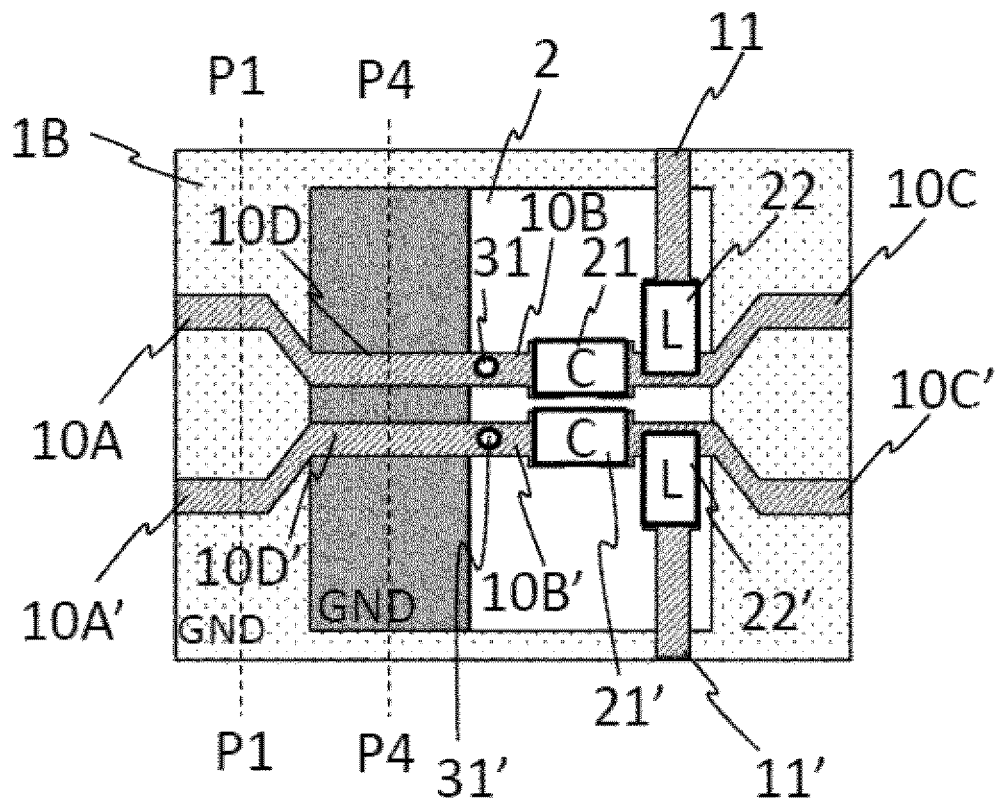
FIG. 4A is a view illustrating an arrangement of a differential transmission board and a mounted element constituting a power superposition differential data communication device according to a third embodiment.
Figure 4B:
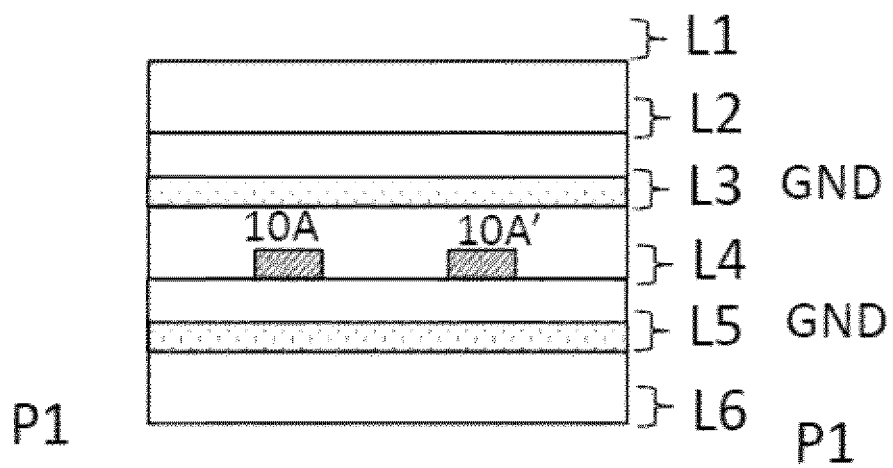
FIG. 4B is a cross-sectional view of the differential transmission board taken along line P1 in FIG. 4A.
Figure 4C:
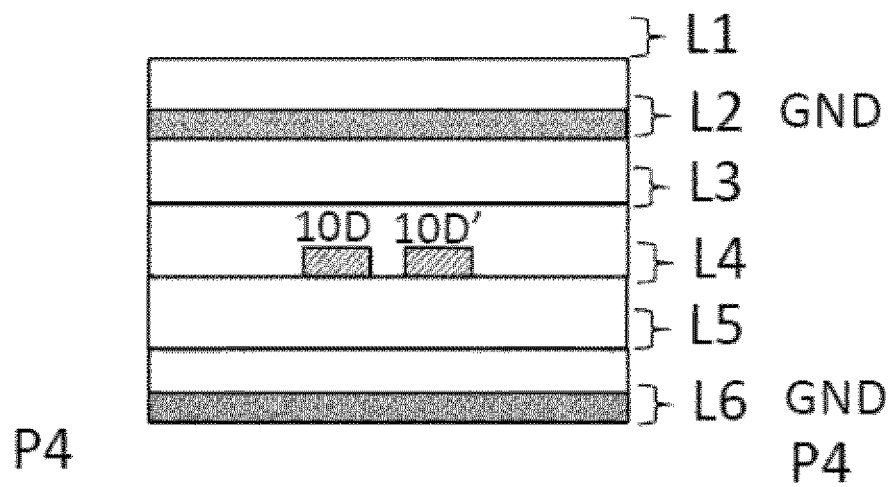
FIG. 4C is a cross-sectional view of the differential transmission board taken along line P4 in FIG. 4A.

Next, a differential transmission board 1B according to a third embodiment will be described with reference to FIGS. 4A to 4C. FIG. 4A is a view illustrating an arrangement of a differential transmission board and a mounted element constituting a power superposition differential data communication device according to the third embodiment. FIG. 4B is a cross-sectional view of the differential transmission board taken along line P1 in FIG. 4A. FIG. 4C is a cross-sectional view of the differential transmission board taken along line P4 in FIG. 4A.

The differential transmission board 1B according to the third embodiment is mounted on a multilayer board having three or more conductor layers (first wiring layer L1 to sixth wiring layer L6), and is a board that superimposes DC power on a differential data signal from a transmission/reception IC and then transmits the signal to a cable. As illustrated in FIG. 4A, the differential transmission board 1B includes a first differential transmission line having a strip line structure including two wiring patterns 10A and 10A', and third differential transmission line 10D, 10D' having a strip line structure including two wiring patterns 10D and 10D' and having a distance between a signal wiring layer and a GND layer larger than that of the first differential transmission line. The differential transmission board 1B further includes a second differential transmission line that passes over a pattern region 2 from which the GND layer has been deleted and includes two wiring patterns 10B and 10B', and a differential transmission line that includes two wiring patterns 10C and 10C'. The differential transmission board 1B further includes two DC transmission lines 11 and 11' that transmit DC power, two capacitor elements 21 and 21' that cut off DC power and pass only a high-speed data signal, and two inductor elements 22 and 22' that cut off a radio-frequency component that is a high-speed data signal and pass only a DC component.

The first differential transmission line 10A, 10A' and the third differential transmission line 10D, 10D' are connected in series, and the capacitor element 21, 21' is connected in series to the third differential transmission line 10D, 10D' and the second differential transmission line 10B, 10B'. The second differential transmission line 10B, 10B' and the DC transmission line 11, 11' are connected via the inductor element 22, 22'.

The characteristic impedance in the differential mode of the first differential transmission line 10A, 10A', the characteristic impedance in the differential mode of the second differential transmission line 10B, 10B', and the characteristic impedance in the differential mode of the third differential transmission line 10D, 10D' are substantially equivalent. In addition, the characteristic impedance in the in-phase mode of the second differential transmission line 10B, 10B' and the third differential transmission line 10D, 10D' is higher than the characteristic impedance in the in-phase mode of the first differential transmission line 10A, 10A'.

In FIG. 4A, the number 31, 31' represents arrangement positions of via electrodes. Although not illustrated in FIGS. 4A to 4C, for example, the fourth wiring layer L4 in which the first differential transmission line (10A, 10A') and the third differential transmission line 10D, 10D' are formed and the first wiring layer L1 in which the second differential transmission line 10B, 10B' and the differential transmission line 10C, 10C' are formed can be electrically connected by a via electrode 31, 31'.

Here, FIG. 4B illustrates a cross-sectional structure of the first differential transmission line 10A, 10A' (portion taken along line P1 in FIG. 4A), and FIG. 4C illustrates a cross-sectional structure of the third differential transmission line 10D, 10D' (portion taken along line P4 in FIG. 4A). As illustrated in FIG. 4B, in the first differential transmission line 10A, 10A', the fourth wiring layer L4 is used as a signal line 10A, 10A', the third wiring layer L3 and the fifth wiring layer L5 are used as GND planes, and the first differential transmission line 10A, 10A' are configured by the fourth wiring layer L4. The first differential transmission line 10A, 10A' has a so-called strip line structure in which the characteristic impedance is determined by the wiring width of the fourth wiring layer L4, and the insulator thickness and the dielectric constant between the third wiring layer L3 and the fourth wiring layer L4 and between the fourth wiring layer L4 and the fifth wiring layer L5. Therefore, the first differential transmission line 10A, 10A' has a feature that the characteristic impedance in the differential mode and the characteristic impedance in the in-phase mode are substantially equivalent.

On the other hand, in the third differential transmission line 10D, 10D', the fourth wiring layer L4 is used as a signal line 10D, 10D' similarly to the first differential transmission line (10A, 10A'), but the second wiring layer L2 and the sixth wiring layer L6 are used as GND planes. Therefore, in the third differential transmission line 10D, 10D', the characteristic impedance in the differential mode is determined by the wiring width of the fourth wiring layer L4, the distance between the differential wirings 10D and 10D', and the insulator thickness and the dielectric constant between the second wiring layer L2 and the fourth wiring layer L4 and between the fourth wiring layer L4 and the sixth wiring layer L6, but the characteristic impedance in the in-phase mode is determined by the wiring width of the fourth wiring layer L4, and the insulator thickness and the dielectric constant between the second wiring layer L2 and the fourth wiring layer L4 and between the fourth wiring layer L4 and the sixth wiring layer L6. Therefore, the characteristic impedance in the in-phase mode of the third differential transmission line 10D, 10D' can be higher in the third differential transmission line 10D, 10D' having the insulator thicknesses of the signal wiring layer and the GND layer larger than in the first differential transmission line 10A, 10A'. As described above, by having the differential transmission board 1B including at least one third differential transmission line having a high characteristic impedance in the in-phase mode, reflection in the in-phase mode is increased, and as a result, in the differential transmission board 1B, in-phase noise can be reduced without inserting a common-mode choke coil.

Here, in the third differential transmission line 10D, 10D', a microstrip line having a GND layer on the upper side (here, the second wiring layer L2) or the lower side (here, the sixth wiring layer L6) of the third wiring layer L3 of the signal line 10D, 10D', or a strip line structure having GND layers on the upper and lower sides (here, the second wiring layer L2 and the sixth wiring layer L6) of the third wiring layer L3 of the signal line 10D, 10D' can be adopted.

In addition, the GND plane immediately below the second differential transmission line or a pattern equivalent thereto is removed.

As in the third embodiment, by sandwiching the third differential transmission line 10D, 10D' having a high characteristic impedance in the in-phase mode between the second wiring layer L2 and the sixth wiring layer L6 as GND planes, it is possible to reduce the amount of noise jumping from external noise to the third differential transmission line 10D, 10D'. Thereby, the amount of in-phase noise emitted by the cable can also be reduced. Furthermore, in the region where the third differential transmission line 10D, 10D' is arranged, the surface mounted element can be arranged in the first wiring layer L1 of the surface layer. Therefore, there is also an effect that the differential transmission board 1B can be efficiently used.

It goes without saying that the area of the differential transmission board 1B can be reduced using the meander line configuration described in the second embodiment also in the differential transmission line 10B, 10B' in the third embodiment.

Fourth Embodiment

Figure 5:
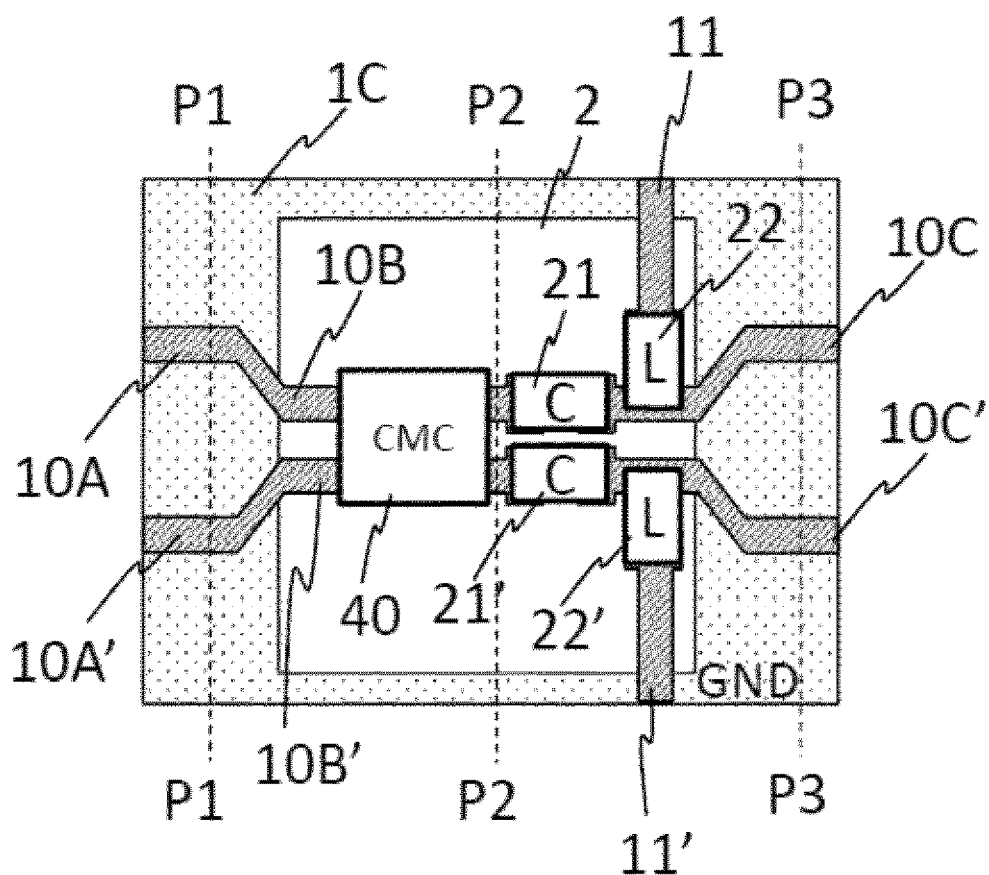
FIG. 5 is a view illustrating an arrangement of a differential transmission board and a mounted element constituting a power superposition differential data communication device according to a fourth embodiment.

Next, a differential transmission board 1C according to a fourth embodiment will be described with reference to FIG. 5. FIG. 5 is a view illustrating an arrangement of a differential transmission board and a mounted element constituting a power superposition differential data communication device according to the fourth embodiment.

As illustrated in FIG. 5, the differential transmission board 1C according to the fourth embodiment is a board that superimposes DC power on a differential data signal from a transmission/reception IC and then transmits the signal to a cable, and includes a first differential transmission line having a microstrip line structure including two wiring patterns 10A and 10A', a second differential transmission line including two wiring patterns 10B and 10B' passing over a pattern region 2 from which a GND layer is deleted, and two DC transmission lines 11 and 11' that transmit DC power. The differential transmission board 1C further includes a common-mode choke coil 40 having a low impedance in a differential mode and a high impedance in an in-phase mode, two capacitor elements 21 and 21' that cut off DC power and pass only a high-speed data signal, and two inductor elements 22 and 22' that cut off a radio-frequency component that is a high-speed data signal and pass only a DC component. The first differential transmission line (10A, 10A') and the second differential transmission line (10B, 10B') are connected in series. The common-mode choke coil 40 and the capacitor element 21, 21' are connected in series to the second differential transmission line (10B, 10B'). The second differential transmission line (10B, 10B') and the DC transmission line 11, 11' are connected via the inductor element 22, 22'. The characteristic impedance in the differential mode of the first differential transmission line (10A, 10A') is substantially equivalent to the characteristic impedance in the differential mode of the second differential transmission line (10B, 10B'). In addition, the characteristic impedance in the in-phase mode of the second differential transmission line (10B, 10B') is higher than the characteristic impedance in the in-phase mode of the first differential transmission line (10A, 10A').

In the differential transmission board 1C according to the present embodiment, by using both the common-mode choke coil 40 and the second differential transmission line (10B, 10B') having a high characteristic impedance in the in-phase mode, there is an effect of increasing the effect of reducing in-phase noise. Furthermore, the use of the common-mode choke coil 40 with lower cost, the use of the second differential transmission line 10B, 10B' having a large effect of reducing in-phase noise at a radio frequency, and the use of the common-mode choke coil 40 excellent in removal of low-frequency components provide an advantage that in-phase noise can be reduced in a wide frequency range in the differential transmission board 1C.

Fifth Embodiment

Figure 6:
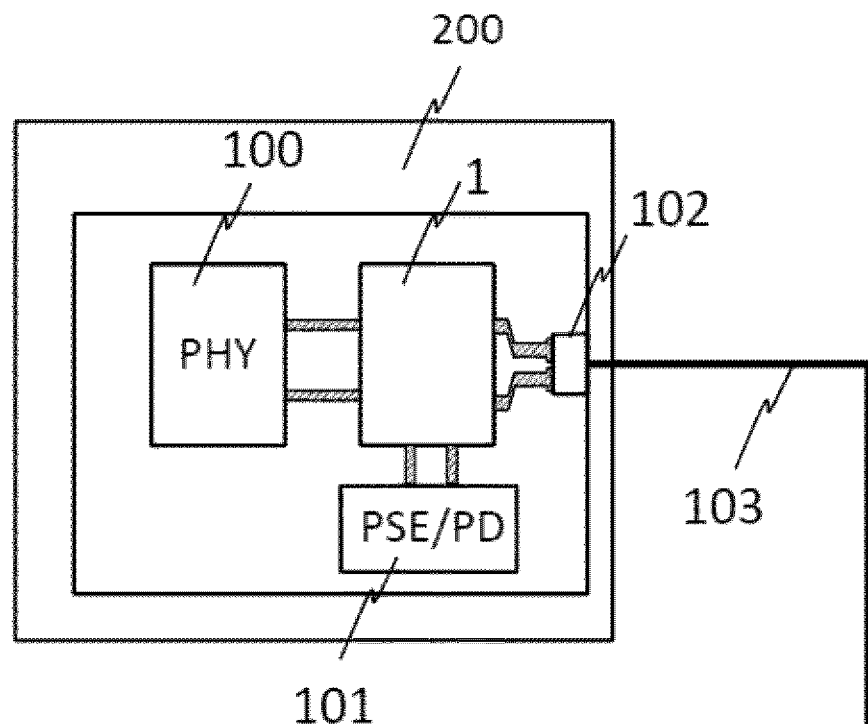
FIG. 6 is a view illustrating a power superposition differential data communication device according to a fifth embodiment.
Figure 6:
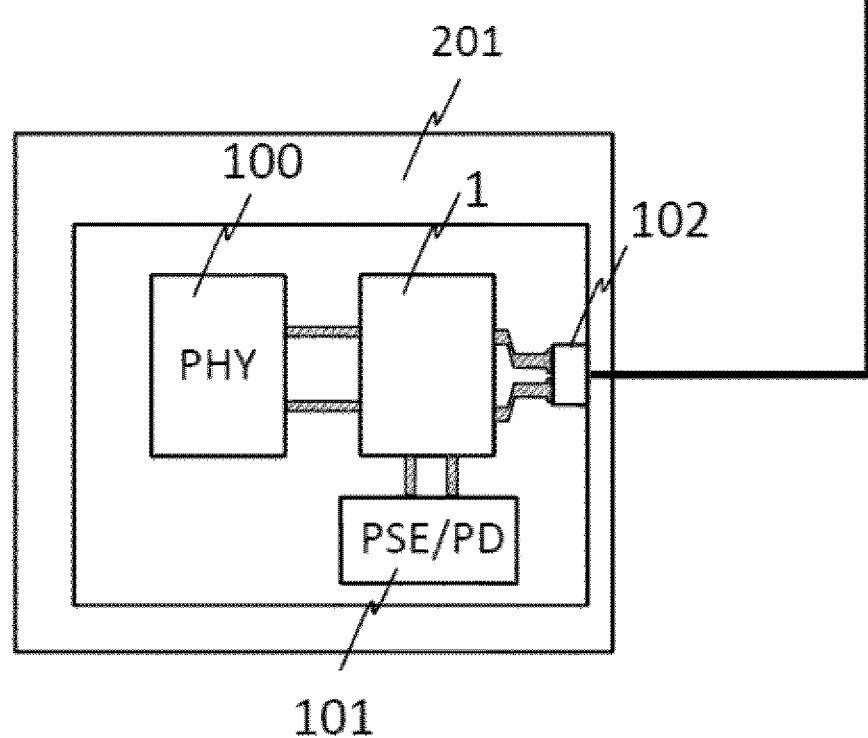

Next, a power superposition differential data communication device 200 according to a fifth embodiment will be described with reference to FIG. 6. FIG. 6 is a view illustrating a power superposition differential data communication device according to the fifth embodiment.

As illustrated in FIG. 6, the first power superposition differential data communication device 200 according to the fifth embodiment is a power superposition differential data communication device that superimposes DC power on a differential data signal from a transmission/reception IC (also referred to as a transmission/reception device) 100 and then transmits the signal to a cable 103. For example, a second power superposition differential data communication device 201 having the same configuration as the first power superposition differential data communication device 200 is connected to the other end of the cable 103 to constitute a differential data communication system 220.

Each of the power superposition differential data communication devices 200 and 201 includes a transmission/reception IC 100 that transmits and receives differential transmission data, the differential transmission board 1 (or 1A to 1C) described in the first to fourth embodiments, a DC power transmission/reception device (DC power transmission and reception device) 101 that transmits or receives DC power, and a connector 102 for connecting a differential data signal on which DC power is superimposed to the cable 103 outside the power superposition differential data communication devices 200 and 201. As the cable 103, for example, an unshielded twisted pair cable (UTP cable) or a shielded twisted pair cable (STP cable) can be used. In this example, the DC power transmission device/DC power reception device 101 includes power source equipment (PSE) and power receiving equipment (PD).

The differential transmission/reception data signal wiring from the transmission/reception IC 100 and the differential transmission board 1 (or 1A to 1C) are connected in series (the differential t transmission/reception data signal wiring from the transmission/reception IC 100 is connected to the wiring pattern 10A, 10A' of FIG. 1A). The power wiring from the DC power transmission/reception device 101 is connected in parallel to the differential transmission board 1 (the power wiring from the DC power transmission/reception device 101 is connected to wiring pattern portion 11, 11' of FIG. 1A). In the differential transmission board 1 (or 1A to 1C), DC power is superimposed on a differential data signal, and then the differential transmission board 1 is connected to the connector 102 (the connector 102 is connected to the wiring pattern portion 10C, 10C' in FIG. 1). As a result, it is possible to realize the power superposition differential data communication devices 200 and 201 by PoDL at low cost.

Each of the power superposition differential data communication devices 200 and 201 may be built in, for example, an electronic control unit (ECU) in an automobile to perform power superposition differential data communication between the ECU and the ECU. In addition, the power superposition differential data communication device 200 may be built in a sensor in an automobile, and the power superposition differential data communication device 201 may be built in an ECU in the automobile to perform power superposition differential data communication between the sensor and the ECU.

As a result, it is possible to reduce the in-phase noise generated in the transmission/reception IC and the in-phase noise jumping to the differential transmission board from being radiated from the cable 103. In addition, the differential transmission board used in the power superposition differential data communication device can be configured at low cost by reducing the number of components as much as possible. In addition, by the power superposition differential data communication devices 200 and 201, it is possible to provide the differential data communication system 220 capable of realizing power superposition differential data transmission with low radiation noise at low cost and capable of operating at a radio frequency.

Although the invention made by the present inventors has been specifically described above based on the embodiments, the present invention is not limited to the above embodiments, and it goes without saying that various modifications can be made.

REFERENCE SIGNS LIST 1, 1A, 1B, 1C differential transmission board according to present invention
2 GND layer opening
3 common-mode choke coil
4 differential transmission board
10A one-side signal wiring of differential transmission line in which value of characteristic impedance in differential mode is equivalent to value of characteristic impedance in in-phase mode
10A' signal wiring on other side of differential transmission line paired with one-side signal wiring 10A
10B one-side signal wiring of differential transmission line in which value of characteristic impedance in in-phase mode is higher than characteristic impedance in differential mode
10B' signal wiring on other side of differential transmission line paired with one-side signal wiring 10B
10C one-side signal wiring of differential transmission line in which value of characteristic impedance in differential mode is equivalent to value of characteristic impedance in in-phase mode
10C' signal wiring on other side of differential transmission line paired with one-side signal wiring 10C
10D one-side signal wiring of differential transmission line in which value of characteristic impedance in differential mode is equivalent to value of characteristic impedance in in-phase mode in case of using multilayer board
10D' signal wiring on other side of differential transmission line in case of using multilayer board paired with one-side signal wiring 10D
11 wiring pattern for supplying or receiving DC power
11' wiring pattern for supplying or receiving DC power
21 capacitor element for extracting only differential data signal component from signal in which differential data signal and DC power are superimposed
22 inductor element for extracting only DC power from signal in which differential data signal and DC power are superimposed
100 transmission/reception IC
101 DC power transmission device (PSE)/DC power reception device (PD)
102 connector
103 cable
200, 201 power superposition differential data communication device
220 differential data communication system
P1 line segment representing location of cross-sectional structure of differential transmission board
P2 line segment representing location of cross-sectional structure of differential transmission line in which value of characteristic impedance in in-phase mode is higher than characteristic impedance in differential mode in present invention
P3 line segment representing location of cross-sectional structure of differential transmission board
L1 to L6 conductive layer (wiring layer) in cross-sectional structure of board

The invention claimed is:

1. A differential transmission board that superimposes DC power on a differential data signal from a transmission/reception IC and then transmits the signal to a cable, the differential transmission board comprising:
a first differential transmission line including two wiring patterns;
a second differential transmission line including two wiring patterns;
two DC transmission lines that transmit the DC power;
two capacitor elements that cut off the DC power and pass only the differential data signal; and
two inductor elements that cut off a radio-frequency component that is the differential data signal and pass only a DC component,
wherein the first differential transmission line and the second differential transmission line are connected in series,
the two capacitor elements are connected in series to the second differential transmission line,
the second differential transmission line and the DC transmission line are connected via the two inductor elements, and a characteristic impedance in a differential mode of the first differential transmission line and a characteristic impedance in the differential mode of the second differential transmission line are substantially equivalent, and a characteristic impedance in an in-phase mode of the second differential transmission line is higher than a characteristic impedance in the in-phase mode of the first differential transmission line.

2. The differential transmission board according to claim 1, wherein a GND plane or a pattern equivalent thereto immediately below the second differential transmission line is removed.

3. The differential transmission board according to claim 1, wherein a line length of the second differential transmission line is generally a ¼ wavelength at a focused frequency.

4. The differential transmission board according to claim 1, wherein the second differential transmission line has a meander line structure.

5. A power superposition differential data communication device comprising:
   a transmission/reception IC that transmits and receives differential data;
   the differential transmission board according to claim 1;
   a DC power transmission and reception device that transmits or receives DC power; and
   a connector for connecting the differential data signal on which DC power is superimposed to an external cable,
   wherein differential transmission and reception data signal wirings from the transmission/reception IC are connected to the first differential transmission line of the differential transmission board,
   a power wiring from the DC power transmission and reception device and the two DC transmission lines of the differential transmission board are connected, and
   in the differential transmission board, after the DC power is superimposed on the differential data signal, the differential data signal on which the DC power is superimposed is connected to the connector.

6. A differential transmission board that superimposes DC power on a differential data signal from a transmission/reception IC and then transmits the signal to a cable, the differential transmission board comprising:
   a first differential transmission line including two wiring patterns;
   a second differential transmission line including two wiring patterns;
   a third differential transmission line including two wiring patterns;
   two DC transmission lines that transmit the DC power;
   two capacitor elements that cut off the DC power and pass only the differential data signal; and
   two inductor elements that cut off a radio-frequency component that is the differential data signal and pass only a DC component,
   wherein the first differential transmission line and the third differential transmission line are connected in series,
   the third differential transmission line and the second differential transmission line are connected in series,
   the two capacitor elements are connected in series to the second differential transmission line,
   the second differential transmission line and the DC transmission line are connected via the two inductor elements,
   a characteristic impedance in a differential mode of the first differential transmission line, a characteristic impedance in the differential mode of the second differential transmission line, and a characteristic impedance in the differential mode of the third differential transmission line are substantially equivalent, and characteristic impedances in an in-phase mode of the second differential transmission line and the third differential transmission line is higher than a characteristic impedance in the in-phase mode of the first differential transmission line,
   the third differential transmission line has a microstrip line or strip line structure having a GND layer on an upper side, a lower side, or upper and lower sides of a wiring layer of a signal line of the third differential transmission line, and
   a GND plane or a pattern equivalent thereto immediately below the second differential transmission line is removed.

7. The differential transmission board according to claim 6, wherein the second differential transmission line has a meander line structure.

8. A power superposition differential data communication device comprising:
   a transmission/reception IC that transmits and receives differential data;
   the differential transmission board according to claim 6;
   a DC power transmission and reception device that transmits or receives DC power; and
   a connector for connecting the differential data signal on which DC power is superimposed to an external cable,
   wherein differential transmission and reception data signal wirings from the transmission/reception IC are connected to the first differential transmission line of the differential transmission board,
   a power wiring from the DC power transmission and reception device and the two DC transmission lines of the differential transmission board are connected, and
   in the differential transmission board, after the DC power is superimposed on the differential data signal, the differential data signal on which the DC power is superimposed is connected to the connector.

9. A differential transmission board that superimposes DC power on a differential data signal from a transmission/reception IC and then transmits the signal to a cable, the differential transmission board comprising:
   a first differential transmission line including two wiring patterns;
   a second differential transmission line including two wiring patterns;
   two DC transmission lines that transmit the DC power;
   a common-mode choke coil having a low impedance in a differential mode and a high impedance in an in-phase mode;
   two capacitor elements that cut off the DC power and pass only the differential data signal; and
   two inductor elements that cut off a radio-frequency component that is the differential data signal and pass only a DC component,
   wherein the first differential transmission line and the second differential transmission line are connected in series,
   the common-mode choke coil and the two capacitor elements are connected in series to the second differential transmission line,
   the second differential transmission line and the DC transmission line are connected via the two inductor elements, and
   a characteristic impedance in a differential mode of the first differential transmission line and a characteristic impedance in the differential mode of the second differential transmission line are substantially equivalent, and a characteristic impedance in an in-phase mode of the second differential transmission line is higher than a characteristic impedance in the in-phase mode of the first differential transmission line.

10. A power superposition differential data communication device comprising:
a transmission/reception IC that transmits and receives differential data;
the differential transmission board according to claim 9;
a DC power transmission and reception device that transmits or receives DC power; and
a connector for connecting the differential data signal on which DC power is superimposed to an external cable,
wherein differential transmission and reception data signal wirings from the transmission/reception IC are connected to the first differential transmission line of the differential transmission board,
a power wiring from the DC power transmission and reception device and the two DC transmission lines of the differential transmission board are connected, and
in the differential transmission board, after the DC power is superimposed on the differential data signal, the differential data signal on which the DC power is superimposed is connected to the connector.

* * * * *